US009404758B2

United States Patent
Cheng et al.

(10) Patent No.: US 9,404,758 B2
(45) Date of Patent: Aug. 2, 2016

(54) METHOD AND APPARATUS FOR GENERATING A VEHICLE PATH

(71) Applicant: TRANSOFT SOLUTIONS, INC., Richmond (CA)

(72) Inventors: Steven Kin Shing Cheng, Vancouver (CA); Steven Chi Kit Chan, Coquitlam (CA); Guanggui Pei, New Westminster (CA); Mirza Duric, Vancouver (CA); Li Ding, Richmond (CA); Milton Santano Elias Carrasco, Richmond (CA); Michael Christopher Frost, Burnaby (CA); Shiying Zhang, Richmond (CA)

(73) Assignee: Transoft Solutions, Inc., Richmond, British Columbia (CA)

( * ) Notice: Subject to any disclaimer, the term of this patent is extended or adjusted under 35 U.S.C. 154(b) by 0 days.

(21) Appl. No.: 14/488,780

(22) Filed: Sep. 17, 2014

(65) Prior Publication Data

US 2015/0094945 A1    Apr. 2, 2015

Related U.S. Application Data

(60) Provisional application No. 61/883,755, filed on Sep. 27, 2013.

(51) Int. Cl.
| | |
|---|---|
| *G01C 21/34* | (2006.01) |
| *B60K 31/00* | (2006.01) |
| *G06F 17/50* | (2006.01) |

(52) U.S. Cl.
CPC ............ *G01C 21/34* (2013.01); *B60K 31/0066* (2013.01); *G01C 21/3461* (2013.01); *G06F 17/5009* (2013.01); *G06F 17/5095* (2013.01)

(58) Field of Classification Search
CPC  G01C 21/34; G01C 21/3461; G06F 17/5009; G06F 17/5095; B60K 31/0066

USPC .......................................................... 701/408
See application file for complete search history.

(56) References Cited

U.S. PATENT DOCUMENTS

| | | | | |
|---|---|---|---|---|
| 6,799,100 B2 * | 9/2004 | Burns | ..................... | G08G 1/207 340/436 |
| 8,498,806 B2 * | 7/2013 | Fukano | ................... | E02F 9/261 701/23 |

(Continued)

FOREIGN PATENT DOCUMENTS

KR     2008 0012751      2/2008

OTHER PUBLICATIONS

Extended European Search Report for European Application No. EP 14 18 5020 dated Jul. 31, 2015.

*Primary Examiner* — McDieunel Marc
*Assistant Examiner* — James E Stroud
(74) *Attorney, Agent, or Firm* — Knobbe Martens Olson & Bear LLP

(57) ABSTRACT

A method and apparatus for generating a representation of a vehicle path for display via a computer is disclosed, which involves receiving start location information including a start location and an initial orientation of the vehicle and end location information including a desired end location of the vehicle, and receiving a selection of a vehicle defined by parameters that define a turning behavior of the vehicle. The method involves receiving constraint information identifying at least one constraint to passage of the vehicle between the start and end locations and causing a processor circuit to generate a vehicle path for travel between the start and end locations, the vehicle path based on the turning behavior of the vehicle and being generated such that the vehicle path remains within the at least one constraint.

44 Claims, 15 Drawing Sheets

(56) References Cited

U.S. PATENT DOCUMENTS

| | | | | |
|---|---|---|---|---|
| 8,825,371 B2* | 9/2014 | Prokhorov | G01C 21/3602 340/435 |
| 8,862,390 B2* | 10/2014 | Sugawara | E02F 9/26 701/431 |
| 9,157,758 B2* | 10/2015 | Van Seggelen | G01C 21/3664 |
| 2009/0062971 A1* | 3/2009 | Rottig | G01S 19/14 701/2 |
| 2011/0142364 A1* | 6/2011 | Iibery | G06T 11/40 382/269 |
| 2013/0054133 A1* | 2/2013 | Lewis | G01C 21/3461 701/423 |

* cited by examiner

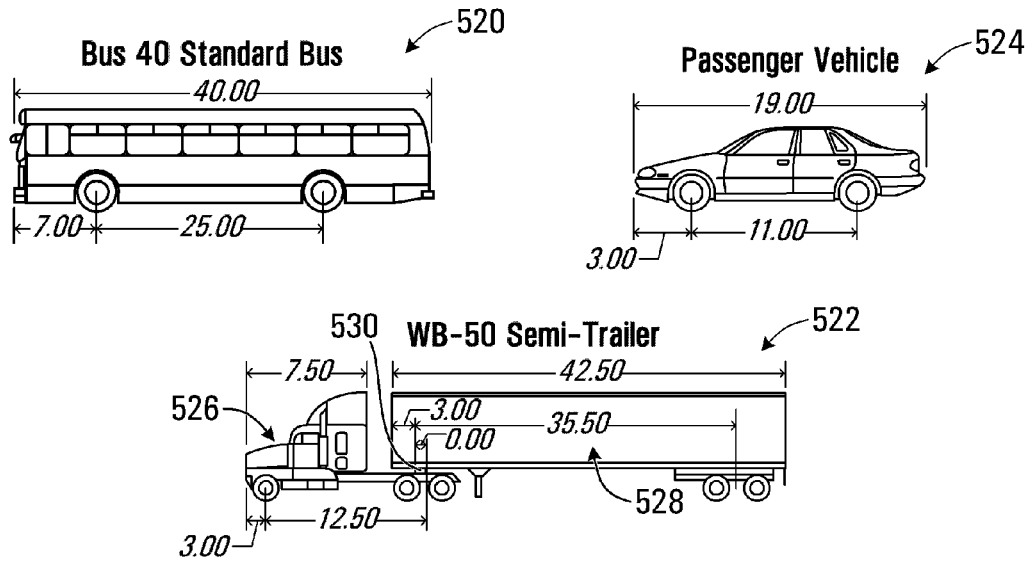

FIG. 5

| | Vehicle Name | | | |
|---|---|---|---|---|
| | Bus 40 Standard Bus | WB-50 Semi-Trailer | P Passenger Car | Units |
| 602 — Steering lock angle | 39.3 | 17.7 | 31.6 | degrees |
| 604 — Lock-to-lock time | 10 | 12 | 6 | seconds |
| 606 — Length | 40 | 55 | 19 | ft |
| 608 — Front Overhang | 6 | 3 | 3 | ft |
| 610 — Width | 8.5 | 8 | 7 | ft |
| 612 — Wheelbase | 25.85 | 12.5 (tractor only) | 11 | ft |
| 614 — Front axle group track | 8.5 | 8 (tractor only) | 6 | ft |
| 616 — Front axle group wheels | 2 | 2 (tractor only) | 2 | each |
| 618 — Rear axle group track | 8.5 | 8 (tractor only) | 6 | ft |
| 620 — Rear axle group wheels | 2 axles, 4 wheels on each | 2 axles, 4 wheels on each (tractor only) | 2 | each |
| 622 — No of parts | 1 | 2 | 1 | each |
| 624 — Pivot location | NA | 3 | NA | ft |
| 626 — Trailer length | NA | 42.5 | NA | ft |
| 628 — Articulating angle | NA | 70 | NA | degrees |

FIG. 6

METHOD AND APPARATUS FOR GENERATING A VEHICLE PATH

CROSS-REFERENCE TO RELATED APPLICATIONS

This application claims priority to under 35 U.S.C. Section 119(e) to Provisional Application 61/883,755, filed on Sep. 27, 2013. The disclosure of this application is hereby incorporated by reference in its entirety. Furthermore, any and all priority claims identified in the Application Data Sheet, or any correction thereto, are hereby incorporated by reference under 37 C.F.R. §1.57.

BACKGROUND OF THE INVENTION

1. Field of Invention

This invention relates generally to traffic engineering and more particularly to generating a representation of a vehicle path for display via a computer.

2. Description of Related Art

Computer aided design of transport infrastructure such as railways, roadways, parking lots and garages, airports and the like may be facilitated by various computer aided design (CAD) software products that represent aspects of the infrastructure so that design choices may be visualized on a computer display. As such, traffic engineering CAD systems provide a valuable input into the design process and facilitate the generation of construction plans that may be used for construction of infrastructure. Additionally online web-based mapping tools, such as Google Maps™ or Google Earth™ provide graphic functionality that may be exploited to show traffic and other infrastructure.

There remains a need in traffic engineering systems for the generation and representation of vehicle paths for movement of vehicles through such infrastructure.

SUMMARY OF THE INVENTION

In accordance with one disclosed aspect there is provided a method for generating a representation of a vehicle path for display via a computer. The method involves receiving start location information at an interface of the computer, the start location information including a start location and an initial orientation of the vehicle at the start location. The method also involves receiving end location information at the interface, the end location information including a desired end location of the vehicle, and receiving at the interface, a selection of a vehicle for which the vehicle path is to be generated, the vehicle being defined by vehicle parameters that define a turning behavior of the vehicle. The method further involves receiving constraint information at the interface, the constraint information identifying at least one constraint to passage of the vehicle between the start location and the end location. The method also involves causing a processor circuit of the computer to generate at least one vehicle path for travel of the vehicle between the start location and the end location, the vehicle path being based on the turning behavior of the vehicle and being generated such that the vehicle path remains within the at least one constraint.

Receiving the end location information may involve receiving end location information including a desired orientation of the vehicle at the end location.

Receiving the constraint information may involve receiving for the at least one constraint a constraint location, and a tolerance value defining a permitted deviation of the vehicle path from the constraint location.

Receiving the constraint information may further involve receiving a desired orientation of the vehicle at the constraint location.

Receiving the constraint information may involve causing the processor circuit to determine whether the turning behavior of the vehicle acts as a constraint to generation of a vehicle path that would be able to reach the end location.

The method may involve causing the processor circuit to display an indication of a range of possible turns that the vehicle is capable of making from the start location and orientation.

Receiving the constraint information may involve receiving information defining a location and extent of an obstacle to movement of the vehicle between the start location and the end location.

Receiving the information defining the location and extent of the obstacle to travel may involve receiving information defining at least one of a man-made structure, a natural landscape feature, and an edge of a roadway or thoroughfare.

The end location may include an intermediate end location and the method may further involve receiving at the interface, end location information including a subsequent desired end location of the vehicle, and causing the processor circuit to generate a subsequent vehicle path portion for travel of the vehicle between the intermediate end location and the subsequent end location.

Causing the processor circuit to generate the at least one vehicle path may involve causing the processor circuit to determine whether the turning behavior of the vehicle acts as a constraint to generation of a vehicle path that would be able to reach the end location and when the turning behavior of the vehicle acts as a constraint causing a warning to be issued, and discontinuing generation of the vehicle path.

The method may involve causing the processor circuit to resume generation of the vehicle path in response to receiving revised end location information at the interface, the revised end location information including an end location that permits generation of a vehicle path that would be able to reach the end location.

Receiving the constraint information may involve receiving constraint information identifying a plurality of constraints and causing the processor circuit to generate at least one vehicle path may involve causing the processor circuit to generate at least one vehicle path for travel of the vehicle between the start location and the end location within each of the plurality of constraints.

Receiving the constraint information may involve receiving constraint information identifying at least one of a roadway that permits travel of a motor vehicle, a taxiway or runway that permits travel of an aircraft, and a railway for travel of rolling stock.

The vehicle parameters include at least one parameter defining an extent of the vehicle and generating the at least one vehicle path may involve generating a vehicle path that causes the at least one extent of the vehicle to remain within the at least one constraint while traveling along the vehicle path.

Receiving the constraint information may involve receiving a data defining a vehicle path portion, and generating the vehicle path may involve generating a vehicle path that includes the vehicle path portion.

Receiving the data defining the vehicle path portion may involve recovering data defining a straight line, a curved line, and a waypoint.

Causing the processor circuit to generate at least one vehicle path may involve causing the processor circuit to generate a plurality of alternative vehicle paths for travel of the vehicle between the start location and the end location within the at least one constraint.

The method may involve receiving at the interface, an operator selection of one of the plurality of alternative vehicle paths.

The method may involve generating a figure of merit for each of the plurality of vehicle paths.

Generating the figure of merit may involve generating a figure of merit for each vehicle path based on at least one of an operator workload associated with steering the vehicle to follow the vehicle path, a number of turns required while following the vehicle path, a time taken to traverse the vehicle path, an expected vehicle speed while following the vehicle path, safety criteria associated with travel along the vehicle path, and a distance over which the vehicle path extends.

Receiving the start location information may involve receiving data defining a line disposed at the start location, the line being oriented to define the orientation of the vehicle at the start location.

Causing the processor circuit to generate the at least one vehicle path may involve causing the processor circuit to generate a path having an initial trajectory extending from the line and aligned in a direction corresponding to an orientation of the line and a length of the initial trajectory is proportional to a length of the line.

Receiving the end location information may involve receiving data defining a line disposed at the end location, the line being oriented to define the desired orientation of the vehicle at the end location.

Causing the processor circuit to generate the at least one vehicle path may involve causing the processor circuit to generate a path having a finishing trajectory aligned in a direction corresponding to the orientation of the line and where a length of the finishing trajectory is proportional to a length of the line.

Receiving the start location information and the end location information may involve causing the processor circuit to display a line in an initial orientation, the line having at least one interactive region for receiving operator input via an input device and may further involve changing at least one of a location and an orientation of the line in response to receiving user input at the at least one interactive region.

The line may include a curved line.

The method may involve receiving at the interface, operator input defining a change to the line and may further involve causing the processor circuit to generate an updated vehicle path for travel of the vehicle based on the changed line.

The vehicle parameters may include at least one parameter defining a reference location on the vehicle and generating the vehicle path may involve causing the processor circuit to display a line along which the reference location moves during passage of the vehicle between the start location and the end location.

The reference location on the vehicle may include one of a location of a steerable wheel of the vehicle, and a location disposed midway between a pair of steerable wheels of the vehicle.

Causing the processor circuit to generate at least one vehicle path may involve causing the processor circuit to generate a vehicle path for travel of the vehicle in one of a forward direction and a reverse direction between the start location and the end location, the vehicle path being based on the turning behavior of the vehicle when moving in the respective directions.

The method may involve causing the processor circuit to read vehicle parameters that define extents of the vehicle and generating a swept path of the vehicle for travel along the vehicle path.

The method may involve causing the processor circuit to generate a plurality of geometric elements representing outer edges of the swept path, each geometric element representing at least a portion of the outer edge and having associated data defining a location and a shape of the geometric element.

In accordance with another disclosed aspect there is provided an apparatus for generating a representation of a vehicle path for display via a computer. The apparatus includes a processor circuit operably configured to receive start location information at an interface of the computer, the start location information including a start location and an initial orientation of the vehicle at the start location. The processor circuit is also operably configured to receive end location information at the interface, the end location information including a desired end location of the vehicle, and to receive at the interface, a selection of a vehicle for which the vehicle path is to be generated, the vehicle being defined by vehicle parameters that define a turning behavior of the vehicle. The processor circuit is further operably configured to receive constraint information at the interface, the constraint information identifying at least one constraint to passage of the vehicle between the start location and the end location. The processor circuit is also operably configured to cause the processor circuit of the computer to generate at least one vehicle path for travel of the vehicle between the start location and the end location, the vehicle path being based on the turning behavior of the vehicle and being generated such that the vehicle path remains within the at least one constraint.

In accordance with another disclosed aspect there is provided a method for generating a representation for display via a computer of a vehicle path between a start location and an end location. The method involves receiving information at an interface of the computer defining lateral boundaries for movement of the vehicle between the start location and the end location. The method also involves receiving at the interface, a selection of a vehicle for which the vehicle path is to be generated, the vehicle being defined by vehicle parameters that define a steering behavior of the vehicle. The method further involves generating a negotiable passage between the lateral boundaries based on the steering behavior of the vehicle, the negotiable passage defining a region of between the lateral boundaries within which the vehicle would be able to steer to negotiate the passage without encroaching on the lateral boundaries, at least a portion of the negotiable passage having sufficient lateral extent to permit the vehicle to follow a plurality of different vehicle paths when moving along the portion. The method also involves generating the vehicle path by selecting between the different vehicle paths to reduce steering movements of the vehicle for movement along the negotiable passage.

Receiving information defining lateral boundaries may involve receiving data defining a left hand boundary curve extending at least partway between the start location and the end location, and receiving data defining a right hand boundary curve extending at least partway between the start location and the end location.

The left hand boundary curve and the right hand boundary curve may be represented by continuous Bezier curves.

At least one obstacle to movement of the vehicle may be disposed between the start location and the end location and receiving information defining lateral boundaries may involve generating the lateral boundaries to avoid the at least one obstacle.

The method may involve receiving at the interface, information imposing a movement preference defining preferred portions for vehicle movement within the lateral boundaries.

The receiving the information imposing a movement preference may involve receiving at least one of user input defining a user-preferred portion within the lateral boundaries, information defining the start location, information defining the end location, information defining an area having a movement constriction, information defining lanes for guiding vehicle movement, information defining an area that may be encroached on by a vehicle, information defining a speed constraint, and information defining a steering rate constraint.

Generating the negotiable passage may involve steering the vehicle along an interim vehicle path extending along each of the lateral boundaries while generating a plurality of vehicle extents, and in response to one of the plurality of vehicle extents encroaching on one of the lateral boundaries, spacing the interim vehicle path inwardly until the vehicle extent is able to pass within the one of the lateral boundaries, and reducing an extent between the lateral boundaries based on the interim vehicle path.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention,

FIG. 5 are a series of side view representations of standard vehicles used in traffic engineering;

FIG. 6 is a table listing exemplary parameters for the vehicles shown in FIG. 5;

DETAILED DESCRIPTION

Figure 1:
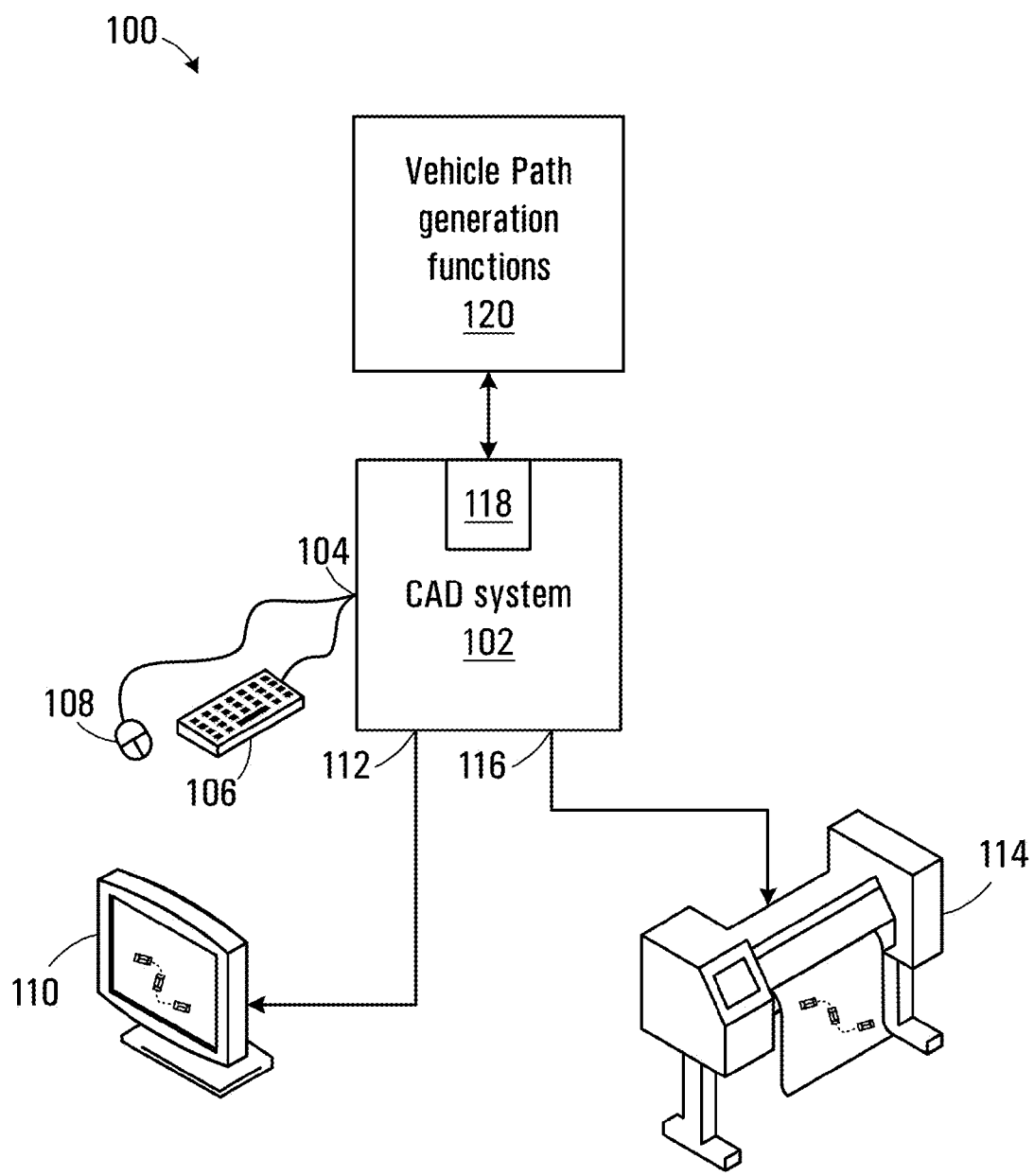
FIG. 1 is a block diagram of an apparatus for generating a representation of a vehicle path in accordance with an embodiment of the invention.

Referring to FIG. 1, a block diagram of an apparatus for generating a representation of a vehicle path for display via a computer is shown generally at 100. The apparatus 100 includes a computer 102 configured to implement a CAD system and having an input 104 for receiving operator input from an input device such as a keyboard 106 and/or a pointing device 108. The pointing device 108 may be a computer mouse, trackball, or digitizing tablet, or other device operable to produce pointer movement signals. The apparatus also includes a display 110 and the computer 102 includes an output 112 for producing display signals for displaying the representation of the vehicle path on the display. The apparatus 100 further includes a plotter 114 and the computer 102 includes an output 116 for producing output data for causing the plotter to print a hardcopy representation of the representation of the vehicle path on the display 110.

The computer 102 also includes an interface 118 that provides access to CAD system functions implemented by the CAD system. The apparatus 100 further includes a vehicle path generation functional block 120, which provides functions for causing the computer 102 to generate the representation of the vehicle path. The vehicle path generation functional block 120 interfaces with the CAD system of the computer 102 through the interface 118. The vehicle path may be generated for a specific traffic infrastructure such as roadways, parking lots, parking garages, airports, railways, and other thoroughfares that facilitate passage of vehicles of various types including bicycles and motor bicycles, passenger cars, trucks, abnormal loads, trains, aircraft and other transportation vehicles and appliances.

The CAD system may be provided by causing a computer to execute CAD system software such as the AutoCAD® software application available from Autodesk Inc. of San Rafael, Calif., USA. AutoCAD provides drawing elements such as lines, polylines, circles, arcs, and other complex elements. Customization of AutoCAD is provided through ObjectARX (AutoCAD Runtime Extension), which is an application programming interface (API) that permits access to a class-based model of AutoCAD drawing elements. Customization code may be written in a programming language such as C++, which may be compiled to provide the functionality represented as the vehicle path generation functional block 120 shown in FIG. 1.

Other CAD systems, such as MicroStation sold by Bentley Systems Inc. of Exton, Pa., USA, provide similar CAD functionality and interfaces for customization. Advantageously, using existing CAD software applications to provide standard CAD functionality allows operators to produce drawing files representing vehicle paths. The resulting drawing files may also be saved in such a manner to permit other operators who do not have access to the vehicle path generation functional block 120, to view and/or edit the drawings.

In other embodiments the CAD system functions may be provided in a web-based mapping program such as Google Maps or Google Earth. For example, Google maps provide an API for interacting with the map data on the Google Map servers and provide functionality that allows others to display additional information to displayed map data provided by Google.

Processor Circuit

Figure 2:
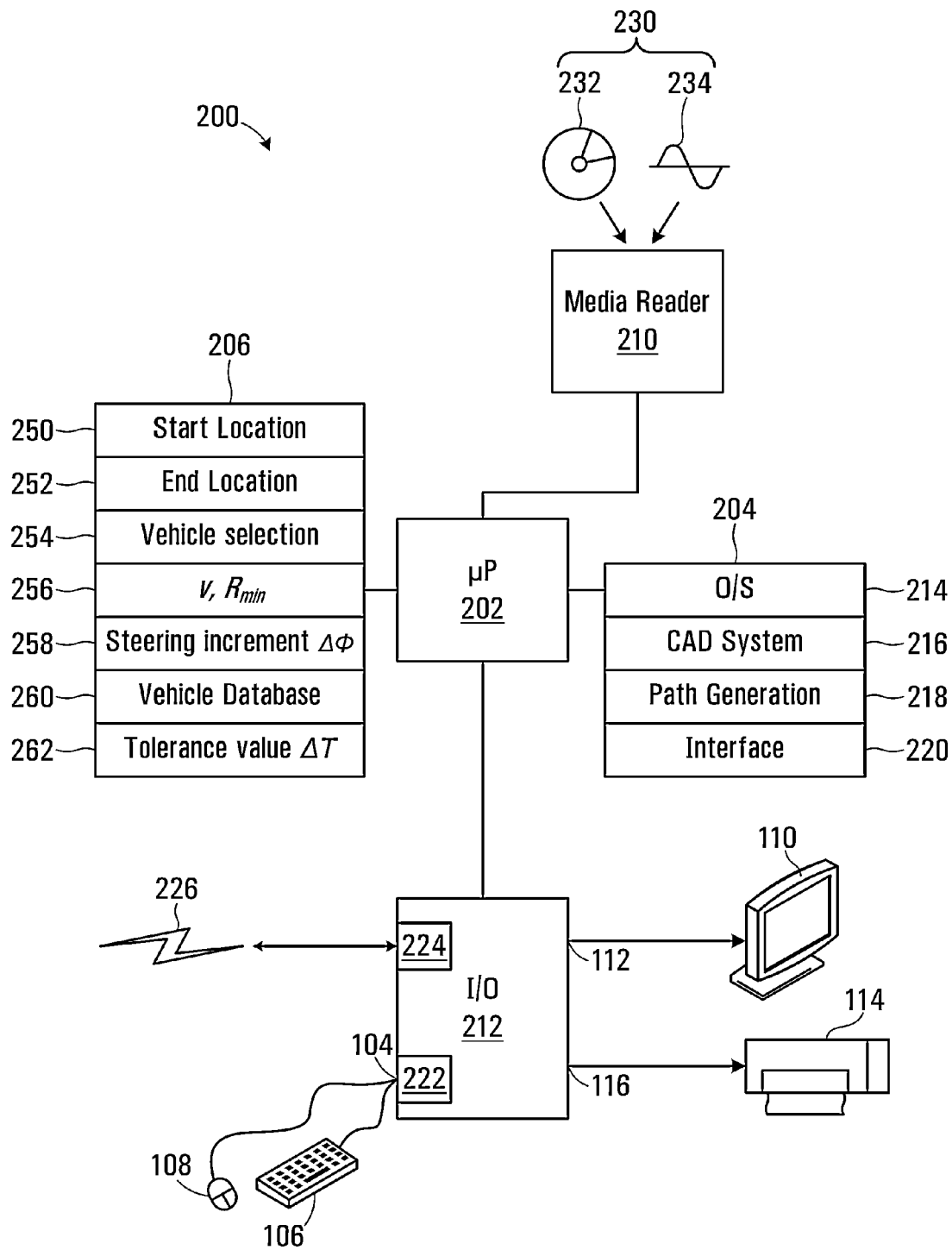
FIG. 2 is a schematic view of a processor circuit for implementing the apparatus shown in FIG. 1.

Referring to FIG. 2, a processor circuit embodiment for implementing the apparatus 100 (shown in FIG. 1) is shown generally at 200. The processor circuit 200 includes a microprocessor 202, a program memory 204, a variable memory 206, a media reader 210, and an input/output interface port (I/O) 212, all of which are in communication with the microprocessor 202.

Program codes for directing the microprocessor 202 to carry out various functions are stored in the program memory 204, which may be implemented as a random access memory (RAM), flash memory, and/or a hard disk drive (HDD), for example. The program memory 204 includes a first block of program codes 214 for directing the microprocessor 202 to perform operating system functions, which in one embodiment may be a version of the Microsoft Windows operating system. The program memory 204 includes a second block of program codes 216 for directing the microprocessor 202 to perform CAD system functions for implementing the CAD system shown in FIG. 1. The program memory 204 also includes a third block of program codes 218 for directing the microprocessor 202 to perform vehicle path generation functions and a fourth block of program codes 220 for directing the microprocessor 202 to provide an interface between the CAD functions and the vehicle path generation functions. As disclosed above, in embodiments where the second block of program codes 216 implement the AutoCAD system, the interface may be provided by the ObjectARX (AutoCAD Runtime Extension) API.

The media reader 210 facilitates loading program codes into the program memory 204 from a computer readable medium 230, such as a CD ROM disk 232, or a computer readable signal 234, such as may be received over a network such as the internet, for example.

The I/O 212 includes a user interface 222 including the input 104 for receiving operator input from the keyboard 106 and pointing device 108. The I/O 212 also includes an interface 224 for communicating via a wireless or wired network 226, such as an intranet or the internet. The I/O 212 further includes the outputs 112 and 116 for producing output data for driving the display 110 and plotter 114.

The variable memory 206 includes a plurality of storage locations including a memory store 250 for storing a start location, a memory store 252 for storing an end location, a memory store 254 for storing a vehicle selection, and a memory store 256 for storing a vehicle speed v and minimum turn radius $R_{min}$. The variable memory 206 also includes a memory store 258 for storing a steering increment, a memory store 260 for storing a vehicle database, and a memory store 262 for storing a tolerance value. The variable memory 206 may be implemented as a Random Access Memory, flash memory, or a hard drive, for example.

Operation

Figure 3:
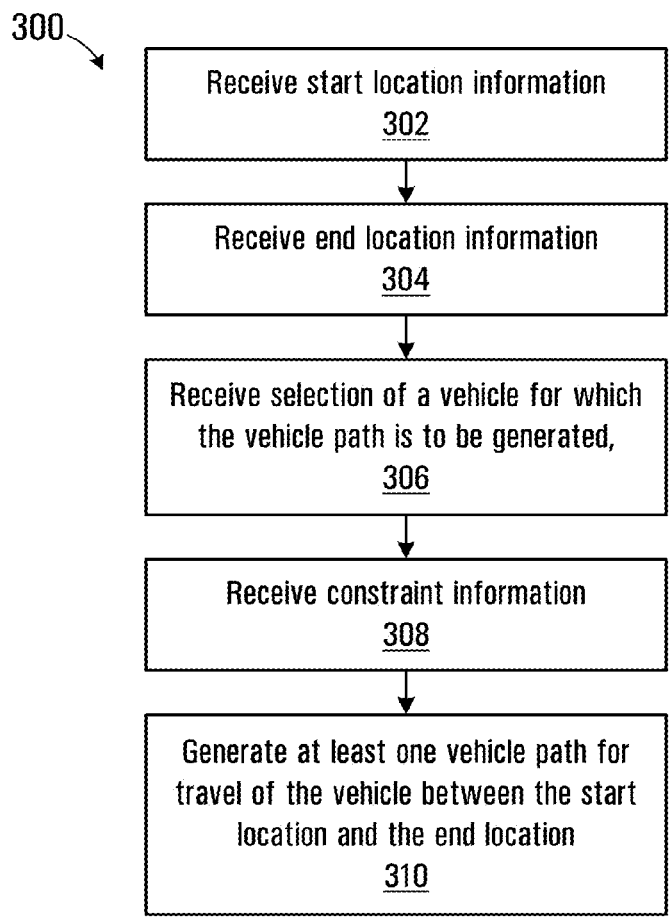
FIG. 3 is a block diagram of a process executed by the processor circuit shown in FIG. 2 for generating a representation of a vehicle path.

Referring to FIG. 3, a flowchart depicting blocks of code for directing the processor circuit 200 to generate a representation of a vehicle path is shown generally at 300. The blocks generally represent codes that may be read from the computer readable medium 230, and stored in the program memory 204, for directing the microprocessor 202 to perform various functions for generating the vehicle path. The actual code to implement each block may be written in any suitable program language, such as C++ or other program language supported by the CAD system implemented by the second block of program codes 216.

Figure 4:
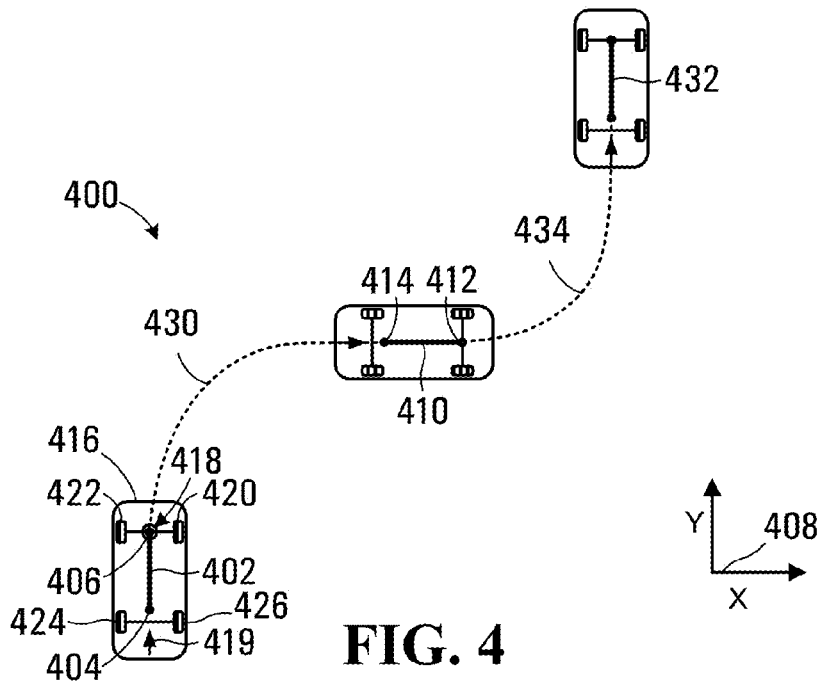
FIG. 4 is a schematic view of a vehicle path representation generated by the processor circuit shown in FIG. 2.

The process begins at block 302, which directs the microprocessor 202 to receive start location information at an interface of the computer such as the interface 222 or interface 226. Referring to FIG. 4, an example of a vehicle path representation is shown generally at 400. The start location is indicated by a start location line 402 having interactive regions 404 and 406, that are configured to permit the operator input to locate and orientate the starting line with respect to an xy coordinate system 408. In this embodiment the location of the start location line 402 within the xy coordinate system 408 defines the start location and the orientation of the start location line defines an initial orientation at the start location. The start location line 402 may thus be defined by coordinates of the interactive regions 404 and 406. In other embodiments the start location may be indicated by a curved line or a point, for example. Block 302 also directs the microprocessor 202 to store the start location information in variable memory 206 at the memory store 250.

Block 304 then directs the microprocessor 202 to receive end location information at the interface 222 or 226. The end location is indicated by an end location line 410 having interactive regions 412 and 414. In this embodiment the location of the end location line 410 within the xy coordinate system 408 defines a desired location and an orientation of the end location line defines an initial orientation of the vehicle at the start location. The end location line 410 may thus be defined by coordinates of the interactive regions 412 and 414 and block 304 also directs the microprocessor 202 to store the start location information in variable memory 206 at the memory store 252. In other embodiments the end location information may define only a location without a desired orientation, in which case the end location line 410 may be replaced by a point or a circle indication the desired end location.

The process 300 then continues at block 306, which directs the microprocessor 202 to receive at the interface 222 or 224, a selection of a vehicle for which the vehicle path is to be generated. In the embodiment shown in FIG. 2, the variable memory 206 includes a vehicle database 260 for storing sets of parameters that define a turning behavior for a plurality of different vehicles and the operator may select one of the vehicles for producing the representation of the vehicle path.

Referring to FIG. 5, side view representations of standard vehicles used in traffic engineering are shown at 520, 522, and 524 respectively. The vehicle 520 is a BUS 40 standard bus, the vehicle 522 is a WB-50 semi-trailer, and the vehicle 524 is a standard passenger car. The vehicles 520, 522, and 524 are taken from the American Association of State Highway and Transportation Officials (AASHTO) library of standard vehicles.

Each of the vehicles 520, 522, and 524 are defined by a plurality of vehicle parameters stored in the database 260 (shown in FIG. 2). Referring to FIG. 6, a table listing exemplary parameters for the vehicles 520-524 is shown generally at 600. The parameter listing 600 includes a steering lock angle parameter 602 representing an angle through which the steering of the vehicle is capable of turning from a straight ahead condition. The parameter listing 600 includes a steering lock-to-lock time 604 ($t_L$) representing a time for an average driver to steer from a left hand steering lock condition to a right hand steering lock condition or vice versa. The value of $t_L$ may be measured for each design vehicle under driving conditions, or a default value (such as 6 seconds) may be assumed for the vehicle.

The parameter listing 600 also includes dimensions for overall vehicle length 606, front overhang 608, body width 610, and wheelbase 612. The front overhang dimension 608 is taken from the center of the front wheel to the front extent of the vehicle and the wheelbase is the dimension between front and rear axles of the vehicle. For the WB-50 vehicle 522 the wheelbase dimension 612 is taken between the center of the front wheel and the center of a rear axle group, which includes two spaced apart axles each having 4 wheels.

The parameter listing 600 also includes parameters associated with a front axle group, including the number of wheels per axle 616 and a track dimension 614. In this embodiment, the track dimension 614 is the distance between outer edges of the tire tread measured across the axle.

The parameter listing 600 also includes parameters associated with a rear axle group, including the number of wheels per axle 620 and a track dimension 618. The parameter listing 600 further includes a number of parts parameter 622, which when set to "1" indicates that the vehicle is an unarticulated vehicle, and for values of "2" or higher indicates that the vehicle articulated. The vehicle 522 is articulated and includes a tractor portion 526 and a trailer portion 528 connected to the tractor portion at a pivot location 530. The parameter listing also includes a pivot location dimension 624, which is referenced to the center of the rear axle group of the tractor 526.

The parameter listing 600 also includes trailer parameters, such as a trailer length parameter 626 and an articulating angle parameter 628. The articulating angle parameter 628 represents is a maximum angle that may exist between a longitudinal centerline of a tractor portion 526 and a longitudinal centerline of a trailer portion 528 when turning the vehicle.

The database 260 stores sets of parameters 600 for a plurality of vehicles, such as the vehicles 520 to 524 shown in FIG. 5, and facilitates selection of such vehicles for producing the representation of the vehicle path. For example, libraries of various standard design vehicles are implemented in the AutoTURN® software product available from Transoft Solutions Inc. of British Columbia, Canada. The libraries include commonly used design vehicles for different countries and also provide for custom definition of vehicles not available in the standard libraries.

Referring back to FIG. 3, following selection of the vehicle from the database 260, block 306 directs the microprocessor 202 to store an identification of the selected vehicle in the memory store 254 and directs the microprocessor 202 to read parameters for the selected vehicle from the vehicle database. In the embodiment shown in FIG. 4 the selected vehicle is a passenger vehicle (P) and is shown at 416 in FIG. 4. The track parameter 552 read from the vehicle database 260 for the passenger vehicle P is used to define a reference location on the vehicle 416, which in this embodiment is a location 418 disposed midway between the pair of steerable wheels 420 and 422 of the vehicle and the arrow 419 indicates the forward movement direction of the vehicle. The vehicle 416 also includes rear wheels 424 and 426, which in this embodiment are not steerable. The reference location 418 is located at the interactive region 406 of the start location line 402 and the vehicle is aligned along the start location line. In other embodiments the reference location may be another location on the vehicle, such as a location of one of the steerable wheels 420 and 422.

Block 308 then directs the microprocessor 202 to receive constraint information at the interface 222 or 224. The constraint information identifies at least one constraint to passage of the vehicle 416 between the start location at start location line 402 and the end location at the end location line 410. In one embodiment the constraint is provided by the turning behavior of the vehicle, and block 308 directs the microprocessor 202 to determine whether the turning behavior of the vehicle acts as a constraint to generation of a vehicle path that would be able to reach the end location defined by the end location line 410. In other embodiments the constraint information may define a location and extent of an obstacle to movement of the vehicle between the start location and the end location, as described later herein.

The process 300 then continues at block 310, which directs the microprocessor 202 to generate at least one vehicle path for travel of the vehicle between the start location and the end location. Referring to FIG. 4, the vehicle path is shown at 430 and is based on the turning behavior of the vehicle 416 and is generated such that the vehicle path remains within the turning constraints of the vehicle.

In one embodiment the end location defined by the end location line 410 may be an intermediate end location and the process 300 may be repeated using the end location line 410 as a new start location at block 302. Blocks 304 and 310 of the process 330 are repeated while blocks 306 and 308 would be redundant and may be omitted. In this case, block 304 would direct the microprocessor 202 to receive a subsequent desired end location of the vehicle 416, such as the end location line 432 and block 310 would generate a further path portion 434 based on the turning behavior of the vehicle 146 and generated such that the further path portion remains within the turning constraints of the vehicle.

Corner Turn

Figure 7:
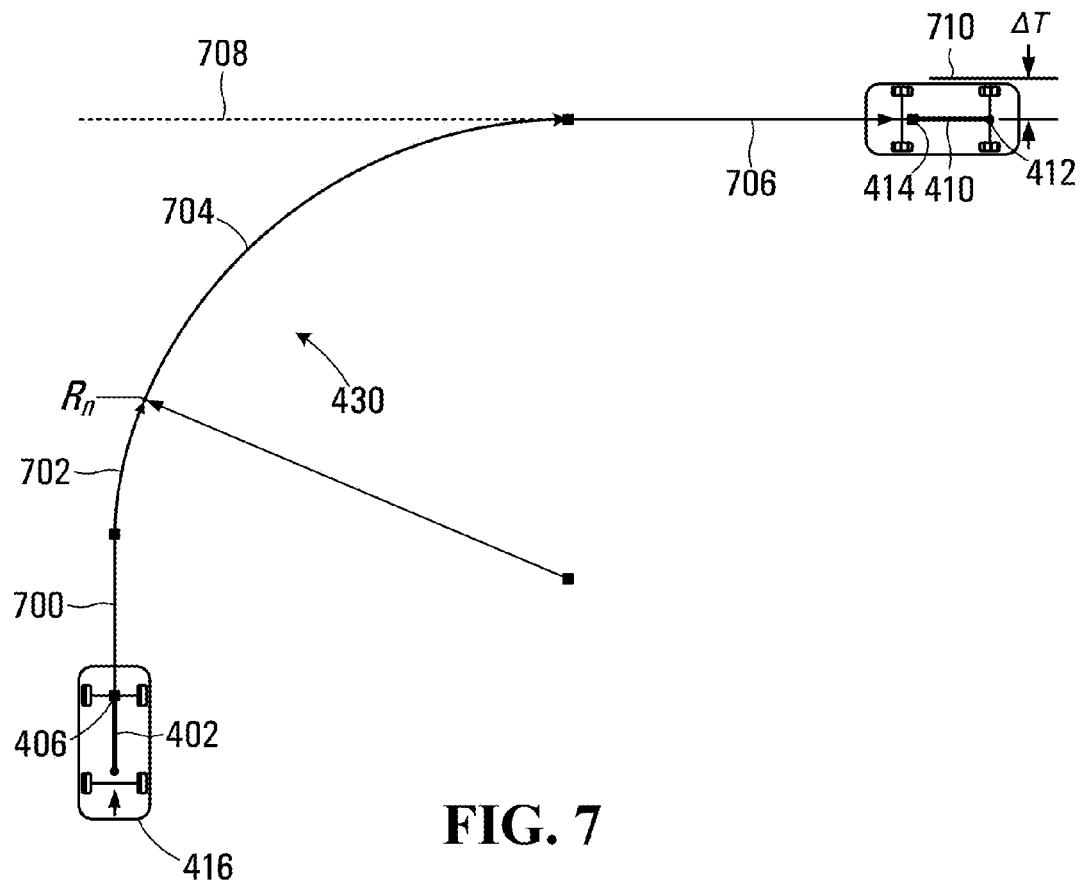
FIG. 7 is a more detailed schematic view of the vehicle path shown in FIG. 4.

The vehicle path 430 is shown in greater detail in FIG. 7. Referring to FIG. 7, the vehicle path 430 extends between the interactive region 406 of the start location line 402 and interactive region 414 of the end location line 410 and in this embodiment the vehicle moved in a forward direction between the start and end locations. The vehicle path 430 includes a plurality of path segments, including a first straight line segment 700, a transition segment 702, an arc segment 704 and a second straight line segment 706.

Figure 8:
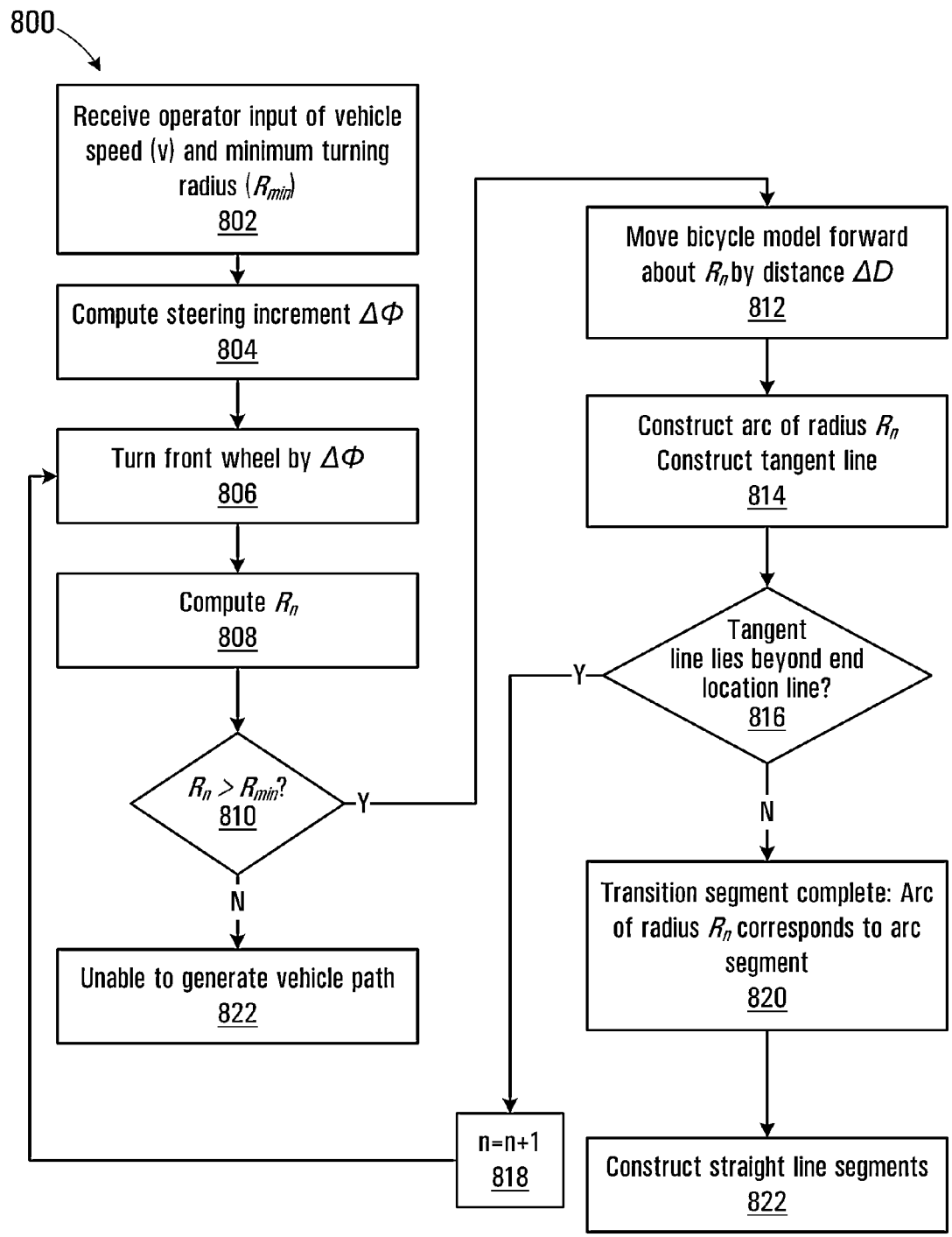
FIG. 8 is a block diagram of a process executed by the processor circuit shown in FIG. 2 for generating a portion of the process shown in FIG. 3.

A process for implementing block 310 of the process 300 is shown in FIG. 8 at 800. The process 800 begins at block 802, which directs the microprocessor 202 to receive a vehicle speed v for the movement of the vehicle 416 between the start and end location. In one embodiment the speed v is provided by operator input, and block 802 directs the microprocessor 202 to store the speed in the memory store 256 of variable memory 206. In other embodiments a default vehicle speed may be assumed for forward movements of the vehicle 416.

Block 802 also directs the microprocessor 152 to compute a minimum turn radius $R_{min}$. In this embodiment the minimum turn radius is computed in accordance with the formula:

$$R_{min} = \frac{v^2}{127\left(\frac{e}{100} + f\right)} \qquad \text{Eqn 1}$$

where:
- $R_{min}$ is the minimum turn radius in meters;
- v is the speed of the vehicle in kilometers per hour;
- e is a superelevation of the surface; and
- f is a side friction factor.

The radius $R_{min}$ is computed and the value of $R_{min}$ is stored in the store 256. In other embodiments $R_{min}$ may be calculated using a different formula or determined from other considerations.

Block 804 then directs the microprocessor 202 to compute a steering increment $\Delta\phi$. In this embodiment the steering increment is computed in accordance with the following formulae:

$$SR = \frac{2\phi_{LA}}{t_L} \quad \text{Eqn 2}$$

where:
- SR is the steering rate in degrees/second;
- $\phi_{LA}$ is the steering lock angle read from the parameter listing 600 in the database 260; and
- $t_L$ is the lock-to-lock time read from the parameter listing 600 in the database 260.

The steering increment is then computed from:

$$\Delta\phi = SR \frac{\Delta D}{v} \quad \text{Eqn 3}$$

where:
- $\Delta D$ is the distance increment;
- v is the speed of the vehicle; and
- $\Delta\phi$ is the steering increment in degrees per distance increment.

In one embodiment the distance increment $\Delta D$ is set to 4 inches. The steering increment $\Delta\phi$ thus represents a maximum rate at which a representative driver would be able to steer the vehicle based on the turning behavior of the vehicle and the vehicle speed. The value of the steering increment $\Delta\phi$ is then written to the store 258 of the variable memory 206.

Figure 9:
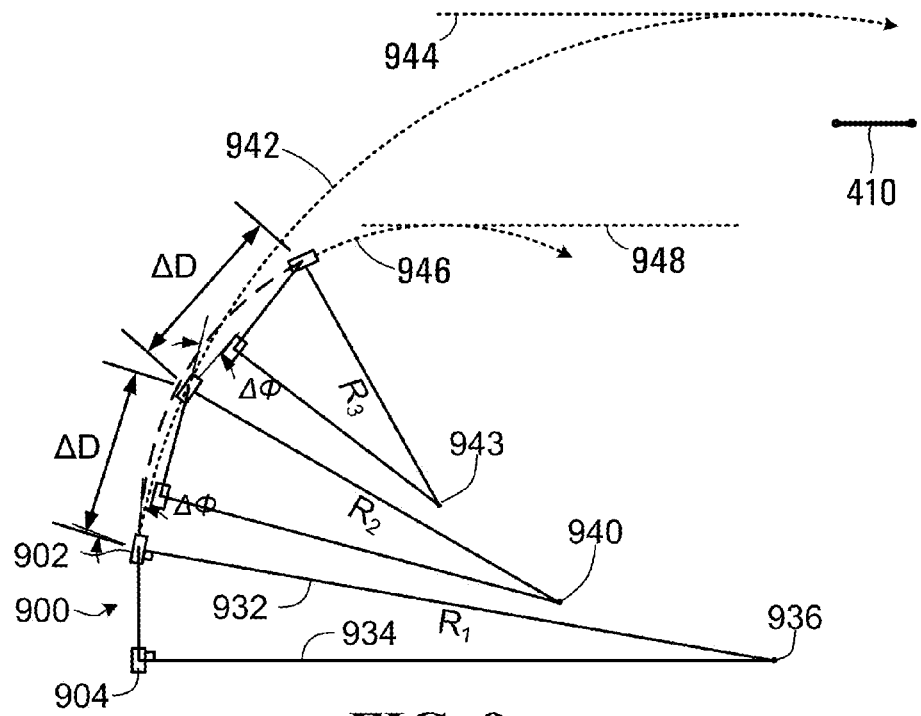
FIG. 9 is a schematic view of a segment of the vehicle path shown in FIG. 7.

Referring to FIG. 9, the vehicle 416 may be represented by a bicycle model 900 for computational convenience when generating the vehicle path 430. The bicycle model 900 corresponds to the vehicle 416 and includes a front wheel 902 and a rear wheel 904, which are separated by a distance 906 corresponding to a wheelbase dimension of the vehicle 416. The front and rear wheels 902 and 904 are centered between the respective front and rear wheels of the vehicle 416 (i.e. the front and rear wheels are each located at half of the respective track dimensions 618 and 618 shown in FIG. 6). The front wheels of the vehicle 416 are steerable and the corresponding front wheel 902 of the bicycle model 900 is also steerable while the rear wheel 904 of the bicycle model is fixed. Various other configurations of bicycle model may be constructed to represent other vehicles from the database 260. For any arbitrary location of the bicycle model 900, the vehicle parameters stored in the vehicle database 260 may be used to determine corresponding locations of the wheels of the vehicle 416. For example, the front left hand wheel 422 of the vehicle 416 is spaced apart from the front wheel 902 of the bicycle model by half of the track width dimension 614.

The process 800 then continues at block 806, which directs the microprocessor 202 to move the bicycle model 900 forward by $\Delta D$ and turn the front wheel 902 by the steering increment $\Delta\phi$. It should be noted that in FIG. 9, the spacing $\Delta D$ is exaggerated for sake of clarity. In practice, as mentioned above, $\Delta D$ may be a small increment of about 4 inches thus producing a large plurality of locations along the vehicle path 430. Block 808 then directs the microprocessor 202 to compute a value of an instantaneous turn radius $R_n$ (where n=1, 2, 3 . . . ). Computing the first radius $R_1$ involves determining an intersection between lines 932 and 934, which each extend perpendicularly outward from the respective front and rear wheels 902 and 904 of the bicycle model 900 in accordance with the formula:

$$R_n = \frac{WB}{\sin n\Delta\phi} \quad \text{Eqn 4}$$

where n=1 for calculating the radius $R_1$ at the first location of the bicycle model and WB is the wheelbase of the design vehicle is read from the vehicle database 260. The Radius $R_1$ defines a center of rotation 936 for a first movement of the bicycle model 900 along the transition segment 702 in FIG. 7. Block 810 then directs the microprocessor 202 to determine whether $R_1$ is greater than the value of $R_{min}$ stored in the memory store 256, in which case the process continues at block 812. Block 812 directs the microprocessor 202 move the bicycle model through the increment $\Delta D$ about the center of rotation 936, such that the front wheel 902 is displaced by a distance $\Delta D$ from the first location.

The process then continues at block 814, which directs the microprocessor 202 to construct an arc of radius $R_n$ centered at the center of rotation 936 and extending outwardly from the front wheel 902 of the bicycle model 900. Block 814 also directs the microprocessor 202 to construct a tangent line 944 that is parallel to the line 410 and tangent to the arc 942.

Block 816 then directs the microprocessor 202 to determine whether the tangent line 944 lies beyond the location line 410 (i.e. above the end location line 410 in FIG. 7), in which case the transition segment 702 and arc segment 704 are not yet complete and block 816 directs the microprocessor 202 to block 818, where n is incremented. Block 818 then directs the microprocessor 202 back to block 806 the remaining blocks of process 800 are repeated. At the repeat of block 806, the front wheel 910 is turned through a further angle $\Delta\phi$ and a radius $R_2$ is computed using Eqn 4 with n=2. The radius $R_2$ defines a new center of rotation 940 for moving the bicycle model 900 from the second location to a third location. Similarly, at the third location, a radius $R_3$ is computed using Eqn 4 with n=3 and the radius $R_3$ defines a new center of rotation 943, an arc 946, and a tangent line 948. Blocks 806-816 of the process 800 continue until at block 816 the tangent line lies on or below the end location line 410. For the third iteration in FIG. 9, the arc 946 has a tangent line 948 that lies below the end location line 410 than thus the transition segment 702 and arc segment 704 are completed and block 816 directs the microprocessor 202 to block 820.

Block 820 directs the microprocessor 202 to complete the transition segment 702 of the vehicle path 430. Block 820 also directs the microprocessor to define the arc segment 704 of the vehicle path 430 using the last arc of radius $R_n$ (i.e. the arc 946). Block 822 then directs the microprocessor 202 to construct the first and second straight line segments 700 and 706. At this point in the process 800 the arc 946 would still lie below or on the end location line 410 and block 822 directs the microprocessor 202 to move the transition segment 702 and arc segment 704 up to the end location line 410 by the distance between the end location line and the tangent line 948. Block 822 also directs the microprocessor 202 to construct the first straight line segment 700 between the interactive region 406 of the start location line 402 and the start of the transition segment 702. Finally block 822 directs the microprocessor 202 to construct the second straight line segment 706 extending between the interactive region 414 of the end location line 410 and the arc segment 704.

The transition segment 702 thus represents a portion of the vehicle path 430 where the driver of the vehicle 416 is steering the vehicle by successive steering increments Δϕ corresponding to an increasingly smaller turning radius $R_n$. In this embodiment, the transition segment 702 thus has a generally spiral shape of reducing radius. The arc segment 704 represents a portion of the path 430 where the driver of the vehicle 416 holds the steering angle constant throughout the segment.

If at block 810, the radius $R_n$ is greater than the value of $R_{min}$ stored in the memory store 256 the microprocessor 202 is directed to block 822 for further processing. In this case, the turning behavior of the vehicle 416 acts as a constraint to generation of the vehicle path 430 that would prevent the vehicle from reaching the end location line 410. In one embodiment block 822 directs the microprocessor 202 to cause a warning to be issued and to discontinue generation of the vehicle path 430.

In another embodiment the end location line 410 has an associated tolerance value ΔT defining a permitted deviation of the vehicle path 430 at the end location. The tolerance value may be set by receiving input from the operator or may be set as a global default and is stored in the store 262 in the variable memory 206. In this embodiment, block 822 directs the microprocessor 202 to read the tolerance value ΔT from the store 262 and to determine whether the vehicle 416 is able to reach a location between the end location line 410 and a line 710 spaced away from the end location line 410 by ΔT as shown in FIG. 7. If the vehicle 416 is able to reach a location within the tolerance value, then block 822 directs the microprocessor 202 to continue the process of blocks 814-822.

While the path generation embodiment shown in FIG. 7 has been described in relation to the start location line 402 and end location line 410 being oriented substantially at right angles, the same process 800 can also be used to generate a vehicle path for start and end location lines that are oriented at angles other than a right angle. Further, in other embodiments the transition segment 702 may be generated using a radius that reduces non-linearly (for example the radius may reduce in a parabolic progression). In still other embodiments a different plurality of segments may be used to make up the vehicle path 430. For example, the arc segment 704 may be followed by a further transition segment leading to the second straight line segment 706.

S-Turn

Figure 10:
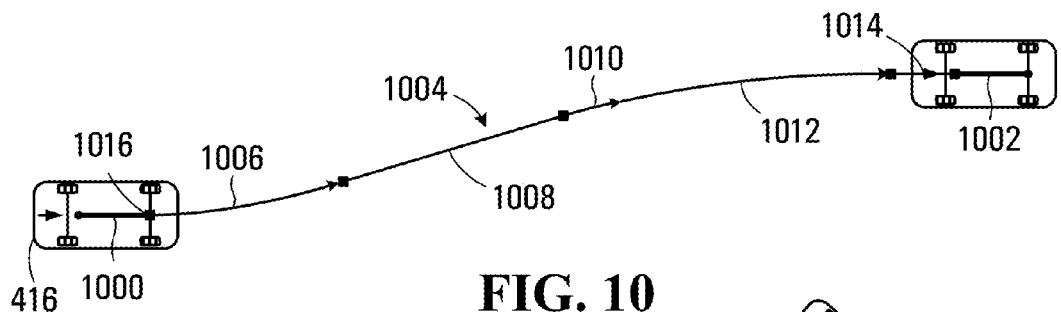
FIG. 10 is a schematic view of a vehicle path in accordance with an alternative embodiment of the invention.

Referring to FIG. 10, in another embodiment a start location line 1000 and the end location line 1002 are oriented such that the vehicle 416 will need to follow an s-shaped vehicle path 1004 between the start location and end location. The combination of segments making up the vehicle path 430 shown in FIG. 7 would not provide for passage of the vehicle between the start location line 1000 and end location line 1002 oriented as shown in FIG. 10. Accordingly, in this embodiment the s-shaped vehicle path 1004 includes a plurality of path segments, including a first transition segment 1006, a first straight line segment 1008, a second transition segment 1010, an arc segment 1012, and a third straight line segment 1014.

The first transition segment 1006 extends outwardly from an interactive region 1016 of the start location line 1000 and is generated following blocks 802 to 812 of the process 800 where the front wheel is advanced by successive increments ΔD while steering the front wheel by successive steering increments Δϕ. At each successive iteration of the blocks 806-812 microprocessor 202 is directed to attempt to complete the vehicle path 1004 by constructing segments 1008, 1010, 1012, and 1014 as described above in connection with FIGS. 7, 8 and 9. The segments 1008, 1010, 1012, and 1014 follow the same sequence of straight line, transition, arc, and straight line segments as the segments 700, 702, 704, and 706 in FIG. 7 and the process 800 may be implemented as described above for the attempt to complete the vehicle path 1004. If at block 810, the radius $R_n$ is greater than $R_{min}$ then it is not yet possible to complete the vehicle path 1004 and the first transition segment 1006 is extended further.

In some embodiments, the start and end locations may be disposed such that either the combination of segments of the vehicle path 430 shown in FIG. 7 or the combination of segments shown in FIG. 10 would both provide viable paths between the start and end locations. In such embodiments, the vehicle path 430 may be preferentially selected over the vehicle path 1004 shown in FIG. 10.

Multiple Intermediate Points

Figure 11:
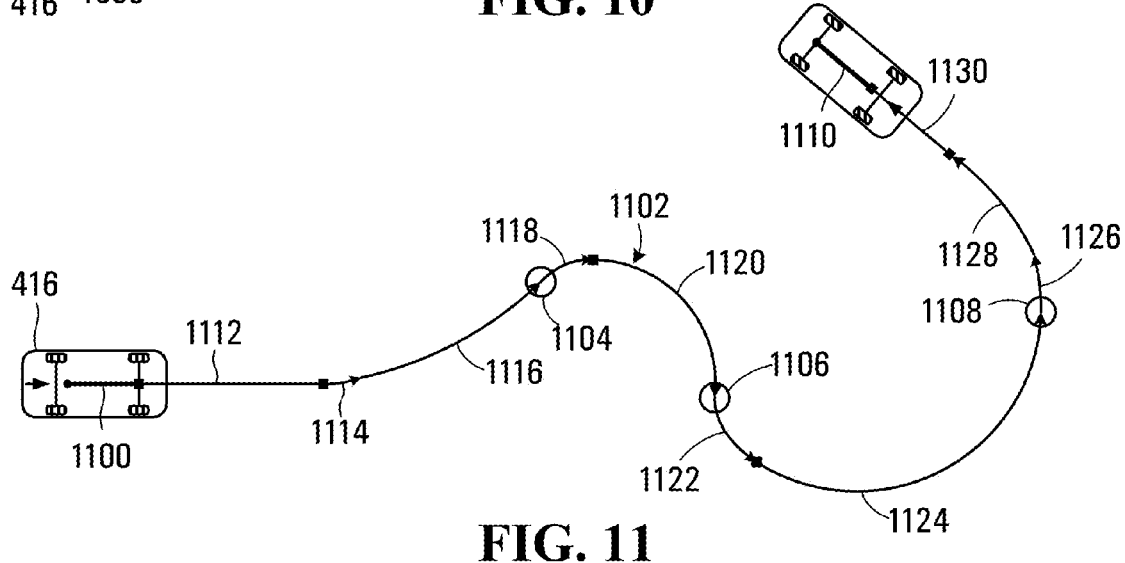
FIG. 11 is a schematic view of a vehicle path in accordance with another embodiment of the invention.
Figure 12:
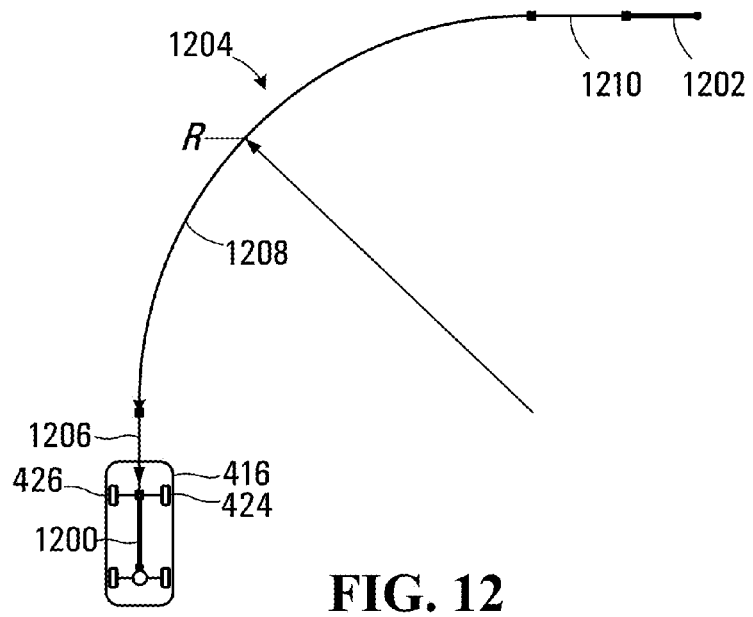
FIG. 12 is a schematic view of a reverse vehicle path in accordance with another embodiment of the invention.

Referring to FIG. 11, in another embodiment a start location line 1100 provides a start location for a vehicle path 1102 that passes through a plurality of intermediate locations. In the embodiment shown the intermediate locations are indicated by a first circle 1104, a second circle 1106, and a third circle 1108 and it is desired that the vehicle path 1102 pass through the center of each of these circles. The embodiment shown also includes an end location 1110. The intermediate locations 1104, 1106 and 1108 may be received as operator input, for example by receiving input from the pointing device 108. The vehicle path 1102 includes a plurality of segments including a first straight line segment 1112, a first transition segment 1114, a first arc segment 1116, a second transition segment 1118, a second arc segment 1120, a third transition segment 1122, a third arc segment 1124, a fourth transition segment 1126, a fourth arc segment 1128 and a second straight line segment 1130.

The first straight line segment 1110, first transition segment 1112, and first arc segment 1114 are generated using blocks 802-820 of the process 800 shown in FIG. 8, where the first transition segment 1114 and first arc segment 1116 are generated to pass through the center of the first circle 1104. Accordingly, the vehicle 416 or a bicycle model representing the vehicle are successively moved through distance increments ΔD while steering the front wheel by steering increments Δϕ until the first arc segment 1114 passes through the center of the first circle 1104.

Bocks 806 to 820 may then be repeated for the second transition segment 1118, and second arc segment 1120 for passing through the second circle 1106. Similarly, the process 800 may be again repeated for the third transition segment 1122 and third arc segment 1124 for passing through the third circle 1108. Finally the process 800 may be again repeated for the fourth transition segment 1126 and the fourth arc segment 1128 and the second straight line segment 1130 may be constructed between the fourth arc segment 1128 as described above in connection with FIGS. 7 and 9.

For more complex vehicles, such as the articulated vehicle 522 shown in FIG. 5, the vehicle paths may be generated in a similar manner by using the appropriate parameters from the vehicle parameter listing 600 shown in FIG. 6.

Reverse Path Generation

The above examples of vehicle paths 430 in FIG. 7, 1004 in FIG. 10, and the vehicle path 1102 in FIG. 11 are generated for forward movement of the vehicle 416. In another embodiment vehicle paths for reverse movements of the vehicle 416 a between start location line 1200 and an end location line 1202 may be generated. In the embodiment shown a reverse vehicle path 1204 is generated for a reference location disposed midway between the pair of rear wheels 424 and 426 of the vehicle 416 and the arrow 419 shows the forward direction of the vehicle.

The path 1204 includes a first straight line segment 1206, an arc segment 1208 and a second straight line segment 1210. While reversing the speed of the vehicle will generally be at very low speed, and in this embodiment spiral or other transition sections are not implemented since it is assumed that if necessary, the driver may turn the front steerable wheels of the vehicle while the vehicle is either stationery or at very low speed. The arc 1208 may thus be generated by successively increasing the steering angle $\Delta\phi$ until an arc segment radius R results in a tangent line as described above in connection with FIG. 9 that is below the end location line 1202. Similarly the straight line segments 1206 and 1210 may be generated in a similar manner to that disclosed in connection with FIG. 7.

In other embodiments an s-turn vehicle path for a reversing vehicle may be generated by generating a first arc segment followed by a second arc segment and then constructing straight line segments at either end of the path.

Figure 13:
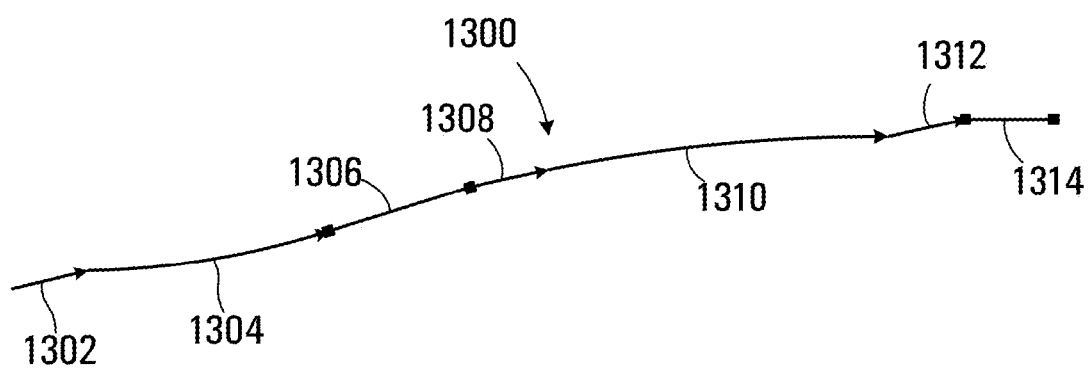
FIG. 13 is a schematic view of a reverse vehicle path for an articulated vehicle in accordance with another embodiment of the invention.

For reversing movements of more complex vehicles, such as the articulated vehicle 522 shown in FIG. 5, movements of the tractor portion 526 and the trailer portion 528 generate a more complex vehicle path. An example of such a path is shown in FIG. 13 at 1300. The path 1300 is for an s-turn path of a 2 part vehicle, which includes a first transition segment 1302, second transition segment 1304, straight line segment 1306, third transition segment 1308, arc segment 1310, fourth transition segment 1312 a second straight line segment 1314. The reverse movement for a 2 part vehicles may be limited to a vehicle speed of 6 mph (10 km/h) or less. At locations along the path 1300 such as between 1302 and 1304 or 1310, 1312 the wheels are turned at stop and the vehicle may be assumed to be starting the next segment of the path from a complete stop.

Combined forward and reverse movements may be generated based on a sequence in which intermediate locations between a start location and end location are input by the operator.

Swept Path Generation

Figure 14:
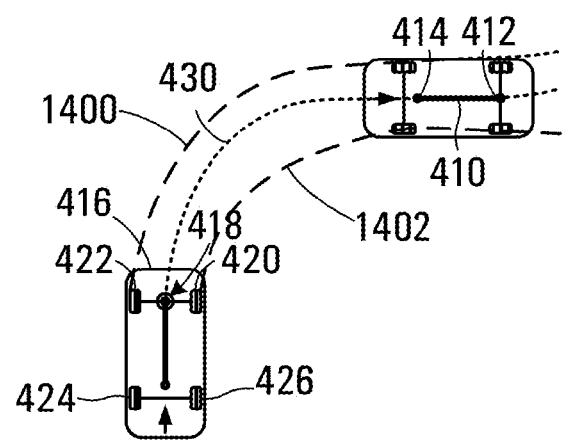
FIG. 14 is a schematic view of a vehicle path representation and swept path extents generated by the processor circuit shown in FIG. 2.

For each of the vehicle path generation embodiments described herein the vehicle parameters in the parameter listing 600 in FIG. 6 may be used to generate vehicle extents associated with passage of the vehicle 416 along the vehicle paths. Referring to FIG. 14, for the vehicle path 430 shown in FIG. 4, the vehicle extents may be defined by the wheels 420-426 of the vehicle extent lines 1400 and 1402 may be generated by offsetting locations of the wheels from to determine a swept path of the vehicle while the vehicle is steered along the vehicle path 430. In a similar manner vehicle extent lines may be generated for any of the disclosed embodiments herein.

Alternate Vehicle Path Generation Embodiment

In another embodiment the constraint to passage of the vehicle between the start location and the end location may be provided by lateral boundaries for movement of the vehicle between the start location and the end location. For example, the lateral boundaries may be provided by a traffic intersection, such as the roundabout intersection representation shown in FIG. 15 at 1500. The representation of the roundabout 1500 includes a central island 1502, surrounded by a circulatory lane 1504. In other embodiments an initial shape of the central island may be elliptical, oval, or an irregular shape. The circulatory lane 1504 extends between the central island 1502 and an outer perimeter 1506. The roundabout 1500 also includes a plurality of approach roadways 1508, 1510, 1512, and 1514, which in this embodiment each include an entry lane and an exit lane. For example, the approach roadway 1508 includes an entry lane 1516 and an exit lane 1518 and the approach roadway 1514 includes an entry lane 1520 and exit lane 1522. In this embodiment the outer perimeter 1506 is used to define portions of a plurality of splitter islands 1524, 1526, 1528, and 1530 that bound the circulatory lane 1504 and also to divide the respective approach roadways 1508-1514 into entry and exit lanes. In this embodiment the roundabout 1500 also includes a truck apron 1532 extending outwardly from the central island 1502 into the circulatory lane 1504. Larger vehicles moving through the roundabout 1500 are permitted to encroach on the truck apron 1532 while smaller vehicles are discouraged from driving on the apron by a painted lane marking, raised portion, or by paving the truck apron using a different paving material, for example.

Figure 15:
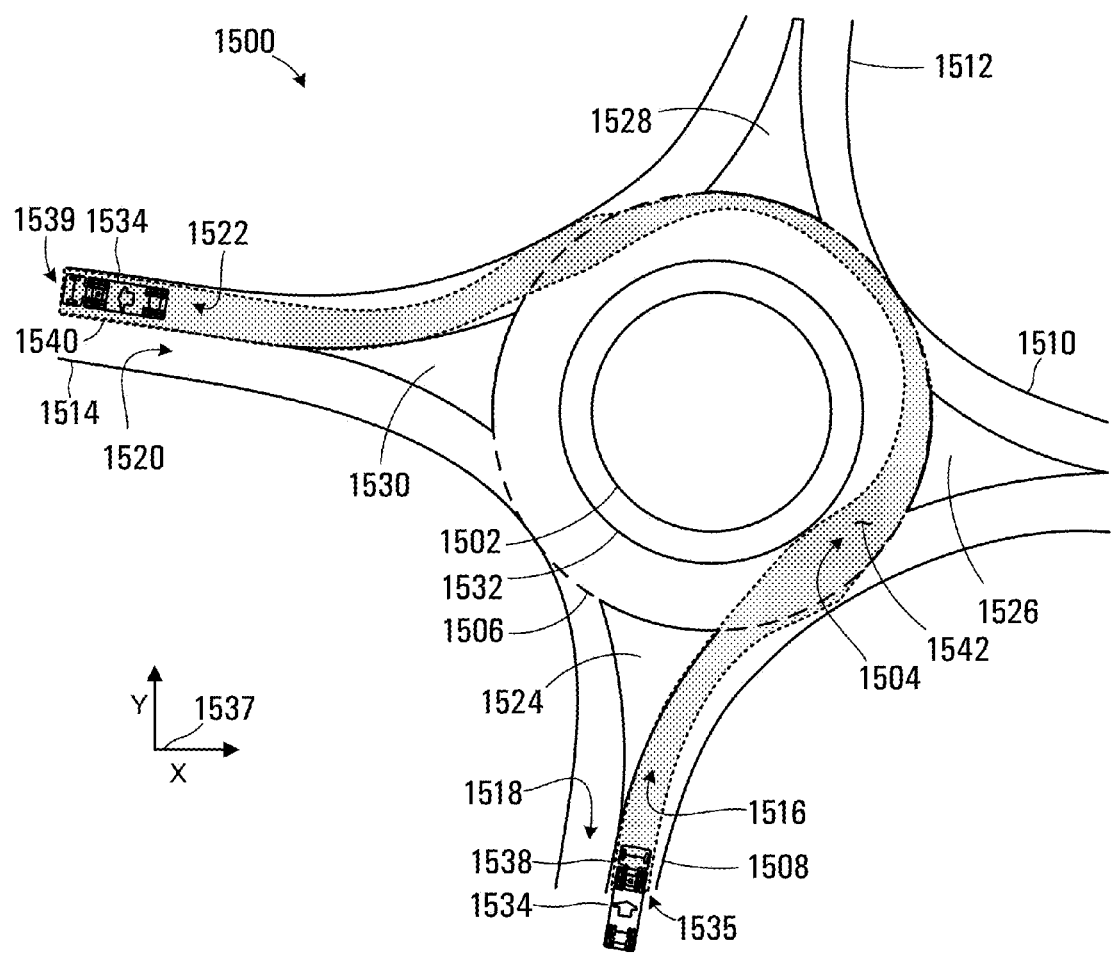
FIG. 15 is a schematic view of a roundabout intersection representation in accordance with another embodiment of the invention.
Figure 16:
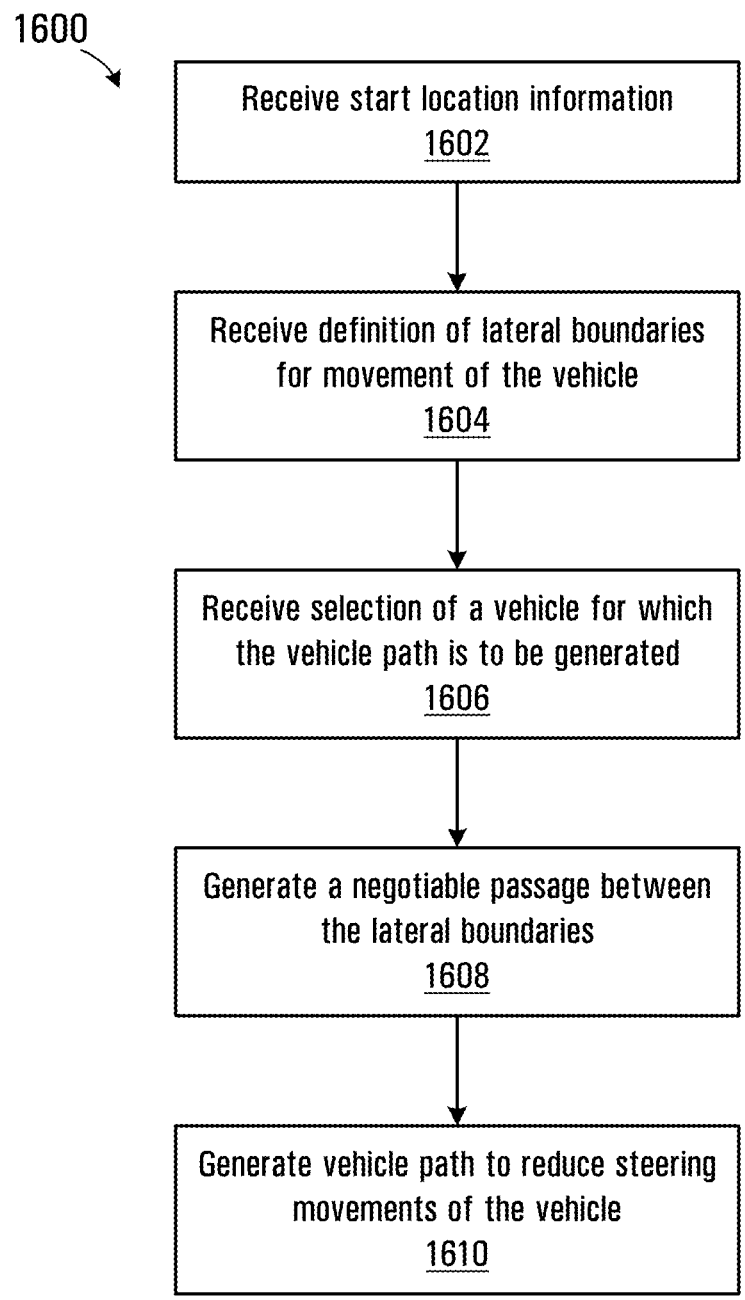
FIG. 16 is a block diagram of a process executed by the processor circuit shown in FIG. 2 for generating a representation of a vehicle path for the intersection shown in FIG. 15.

In the embodiment shown in FIG. 15, a representation of an articulated vehicle 1534 is shown at a start location 1535 adjacent a lane marking 1538 between the entry lane 1516 and exit lane 1518. Referring to FIG. 16, a flowchart depicting blocks of code for directing the processor circuit 200 to generate a representation of a vehicle path for moving the articulated vehicle 1534 from the start location 1535 to an end location 1539 is shown generally at 1600. In the embodiment shown, the end location 1539 is adjacent to a lane marking 1540 between the entry lane 1520 and exit lane 1522 of the approach roadway 1514.

The process 1600 begins at block 1602, which directs the microprocessor 202 to receive start location information defining the start location 1535 at the interface 222 or 226 of the computer. Block 1604 then directs the microprocessor to receive lateral boundaries for movement of the vehicle. Referring back to FIG. 15, in the embodiment shown the lateral boundaries are provided by the central island 1502, outer perimeter 1506, truck apron 1532, and the approach roadways 1508 and 1514 of the roundabout representation 1500. The lateral boundaries may be defined by lines and/or curves in a Cartesian coordinate system represented by the axes 1537. In one embodiment the lateral boundaries are defined by continuous Bezier curves.

The process 1600 then continues at block 1606, which directs the microprocessor 202 to receive a selection of a vehicle for which the vehicle path is to be generated. In this embodiment the vehicle selection may be the WB-50 vehicle defined in the vehicle database parameter listing 600 shown in FIG. 6. The vehicle parameters 600 facilitate a determination of the steering behavior of the articulated vehicle 1534.

Block 1608 then directs the microprocessor 202 to generate a negotiable passage 1542 between the lateral boundaries, the negotiable passage being represented by the shaded region in FIG. 15. The negotiable passage 1542 is based on the steering behavior of the vehicle 1534 and represents a region between the lateral boundaries within which the vehicle would be able to steer to negotiate the roundabout 1500 without encroaching on the lateral boundaries. At least a portion of the negotiable passage 1542 has sufficient lateral extent to permit the vehicle to follow a plurality of different vehicle paths when moving along the portion of the negotiable passage. The negotiable passage 1542 would thus have sufficient extent to accommodate the articulated vehicle 1534 and in some places would allow a driver of the vehicle to select between a number of different steering paths. The process 1600 then continues at block 1610, which directs the microprocessor 202 to select between the different vehicle paths within the negotiable passage 1542 to generate the vehicle path. The vehicle path is selected to reduce steering movements by the driver of the vehicle 1534 for movement along the negotiable passage 1542. Details of a process for implementing block 1610 are described later herein.

Generating Lateral Boundaries and Negotiable Passage

Figure 17:
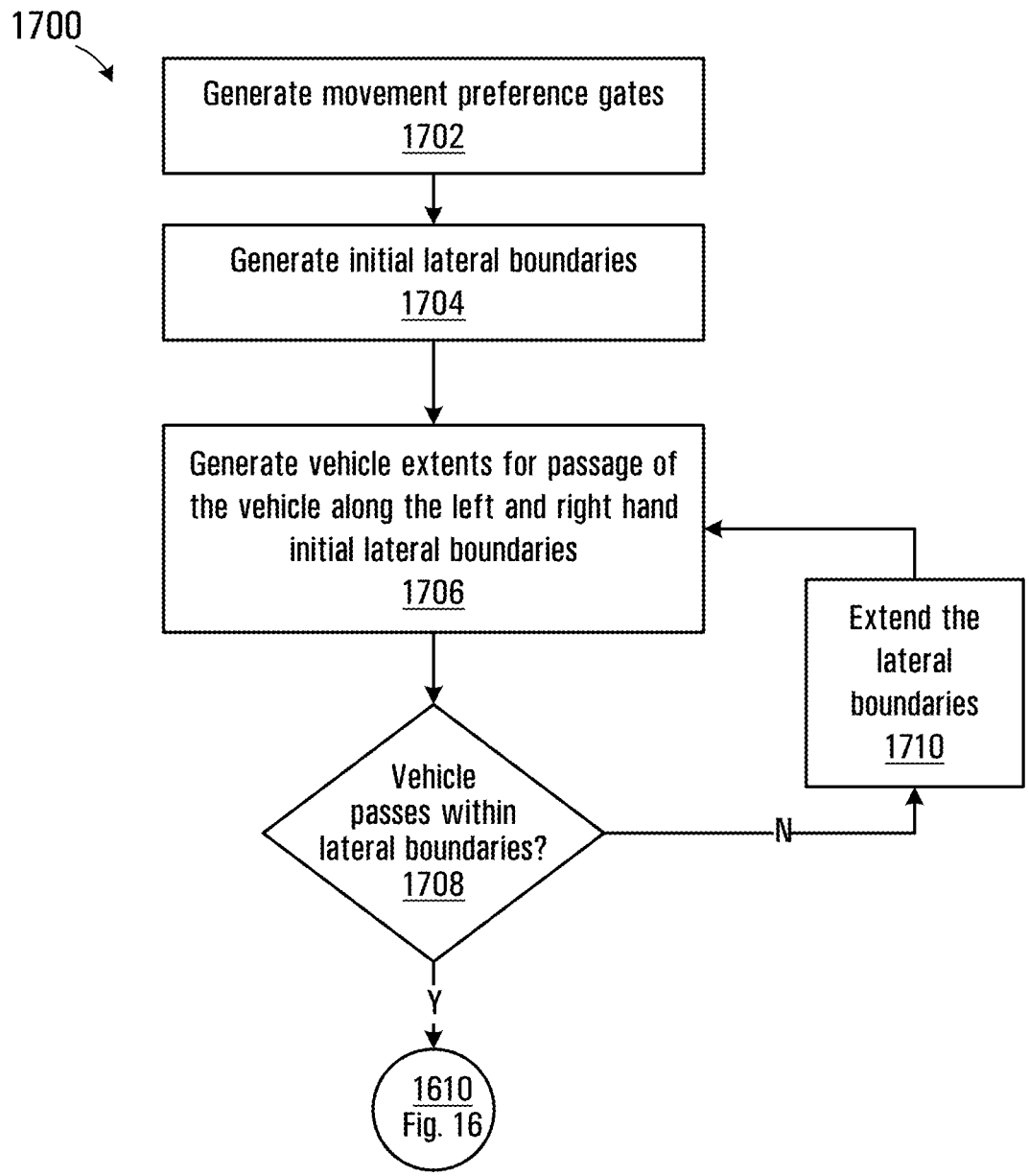
FIG. 17 is a block diagram of a process executed by the processor circuit shown in FIG. 2 for implementing a portion of the process shown in FIG. 16.
Figure 18:
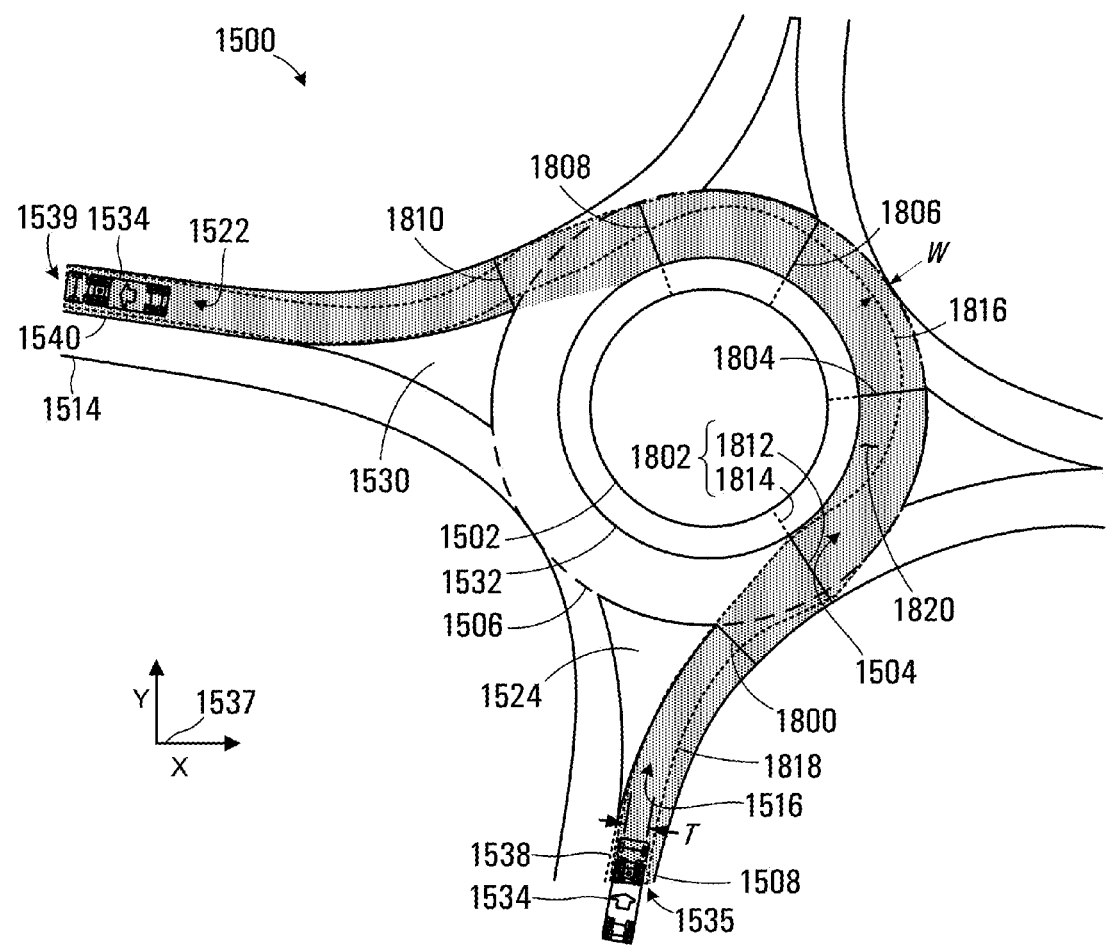
FIG. 18 is a further schematic view of the roundabout intersection representation shown in FIG. 15.

Referring to FIG. 17, a flowchart depicting blocks of code for directing the processor circuit 200 to implement blocks 1604 and 1608 of the process 1600 in accordance with one embodiment is shown generally at 1700. The process 1700 begins at block 1702, which directs the microprocessor 202 to generate a plurality of gates that indicate lateral boundaries and/or movement preferences. Referring to FIG. 18, a plurality of gates 1800-1810 are shown on the roundabout representation 1500. The gate 1800 extends across the entry lane 1516 between the edge of the lane and the splitter island 1524. The gate 1802 has a first gate portion 1812 shown as a solid line extending between the edge of the approach roadway 1508 and the truck apron 1532 and a second portion 1814 shown as a broken line extending from the truck apron to the central island 1502. The portion 1812 represents extents of preferred lateral boundaries while the portion 1814 represents an encroachable lateral boundary portion. The gates 1804-1810 are similarly defined. The gates 1800 and 1810 do not include an encroachable portion since there are obstructions to either side of the gates that cannot be encroached on. For example in the case of gate 1800 the obstacles are the edge of the plurality of approach roadways 1508 and splitter island 1524. Each of the gates 1800-1810 thus designate a drivable passage through the respective gates, while areas outside of the gates represent obstructions to passage of vehicles. In the embodiment shown the gates 1800-1810 are generally perpendicular to the direction of movement through the roundabout 1500, but in other embodiments the gates may be at a greater angle. The gates 1800-1810 may be generated from the geometry of the roundabout 1500 or may be defined by operator input.

The process 1700 then continues at block 1704, which directs the microprocessor 202 to generate initial lateral boundaries for movement of the vehicle. The left hand initial lateral boundary is defined by a continuous Bezier curve extending along the lane marking, edge of the splitter island 1524, the left hand edge of the gate 1800, the truck apron 1532 and left hand edge of the solid portion of gates 1802, 1804, 1806, and 1808, the left edge of the gate 1810, the splitter island 1530, and the lane marking 1540. The right hand lateral boundary is defined by another continuous Bezier curve extending along the edge of the entry lane 1516 of the approach roadway 1508, the right hand edge of the gate 1800, the right hand edge of gate 1802, the outer perimeter 1506 and right hand edges of gates 1804, 1806, and 1808, the right hand edge of gate 1810, and the edge of the exit lane 1522 of the approach roadway 1514. The initial lateral boundaries are represented by the shaded area 1820 in FIG. 18.

Block 1606 then directs the microprocessor 202 to generate vehicle extents for passage of the vehicle 1534 along the left hand initial lateral boundary and the right hand initial lateral boundary while taking account of the steering behaviour of the vehicle. When the vehicle 1534 is steered along a radius by turning the front wheels, the path followed by the rear axel and wheels is displaced with respect to the radius by an off-tracking distance $O_T$ which is given by the following relation:

$$O_T = r_0 - \sqrt{r_0^2 - \Sigma w_k^2 + \Sigma d_k^2}; \qquad \text{Eqn 5}$$

where $r_0$ is the turning radius of the first part of the articulated vehicle at the current position, $w_k$ is the wheelbase of vehicle part k, and $d_k$ is the distance between a rear connection position and rear pivot of the vehicle part k. The vehicle 1534 is steered along the initial left hand lateral boundary by distance increments $\Delta D$, and at each position the initial left hand lateral boundary is spaced inwardly toward the right hand lateral boundary by the off-tracking distance $O_T$ calculated using Eqn 5. The resulting boundary is represented by the broken line at 1816. The vehicle 1534 is then steered along the initial right hand lateral boundary by distance increments $\Delta D$ and at each position the initial right hand lateral boundary is spaced inwardly toward the left hand lateral boundary by the off-tracking distance $O_T$. The resulting right hand boundary is represented by the broken line at 1818. The vehicle 1534 would thus have to steer within the broken lines 1816 and 1818 to avoid encroaching outside the lateral boundaries 1820.

Block 1708 then directs the microprocessor 202 to determine whether the initial lateral boundaries provide sufficient clearance to permit passage of the vehicle 1534. In the embodiment shown in FIG. 18, the vehicle 1534 would encroach on the lateral boundaries, since the width W between the broken lines 1816 and 1818 is less than the track width dimension T of the vehicle 1534. If at block 1708, the vehicle 1534 would encroach on the lateral boundaries the microprocessor 202 is directed to block 1710.

Block 1710 then directs the microprocessor 202 to extend the lateral boundaries. In the embodiment shown in FIG. 18, the gates 1802-1808 define an encroachable portion of the passage (for example the second portion 1814) and the vehicle is therefore permitted to encroach on the truck apron 1532. Block 1710 directs the microprocessor 202 to encroach on the truck apron 1532 by a proportion of the difference between the track width dimension T and the width W. In one embodiment the boundaries are extended by an amount given by the following relation:

$$\Delta B = \frac{(Y - w)}{4} \qquad \text{Eqn 6}$$

where $\Delta B$ is the amount of extension of the left hand lateral boundary onto the truck apron 1532. Since off-tracking of the vehicle 1534 is very sensitive to the geometry of the roundabout 1500, block 1710 only causes the left hand lateral boundary to be moved by a quarter of the difference between the track width dimension T and the width W to avoid an overshoot. Block 1710 directs the microprocessor 202 perform the computation in Eqn 6 for all increments $\Delta D$ along the lateral boundaries and then directs the microprocessor back to block 1706. Blocks 1706-1710 are then repeated until at block 1708 the vehicle is able to pass within the lateral boundaries and the microprocessor is directed back to block 1610 of the process 1600.

Figure 19:
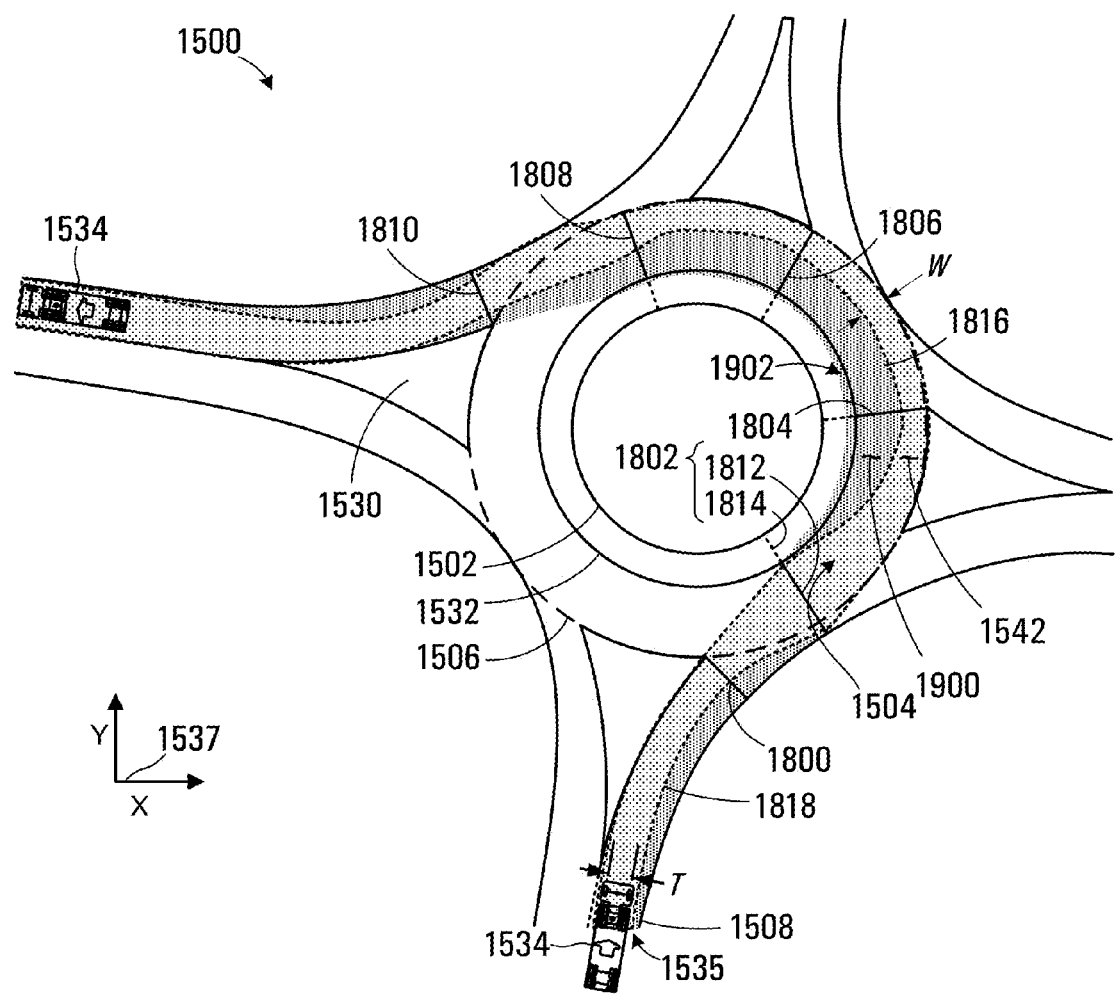
FIG. 19 is another schematic view of the roundabout intersection representation shown in FIG. 15 showing changes to a lateral boundary.

Referring to FIG. 19, the extended lateral boundary is shown as the shaded area 1900 and has an additional portion 1902 extending onto the truck apron 1532. The broken line 1816 has also moved inwardly within the lateral boundaries such that the width W is equal to or greater than the track width T. Under these conditions the vehicle is able to pass through the roundabout 1500 within the lateral boundaries 1900. The area between the broken lines 1816 and 1818 is the negotiable passage shown as the shaded region 1542.

Selecting Vehicle Path

Figure 20:
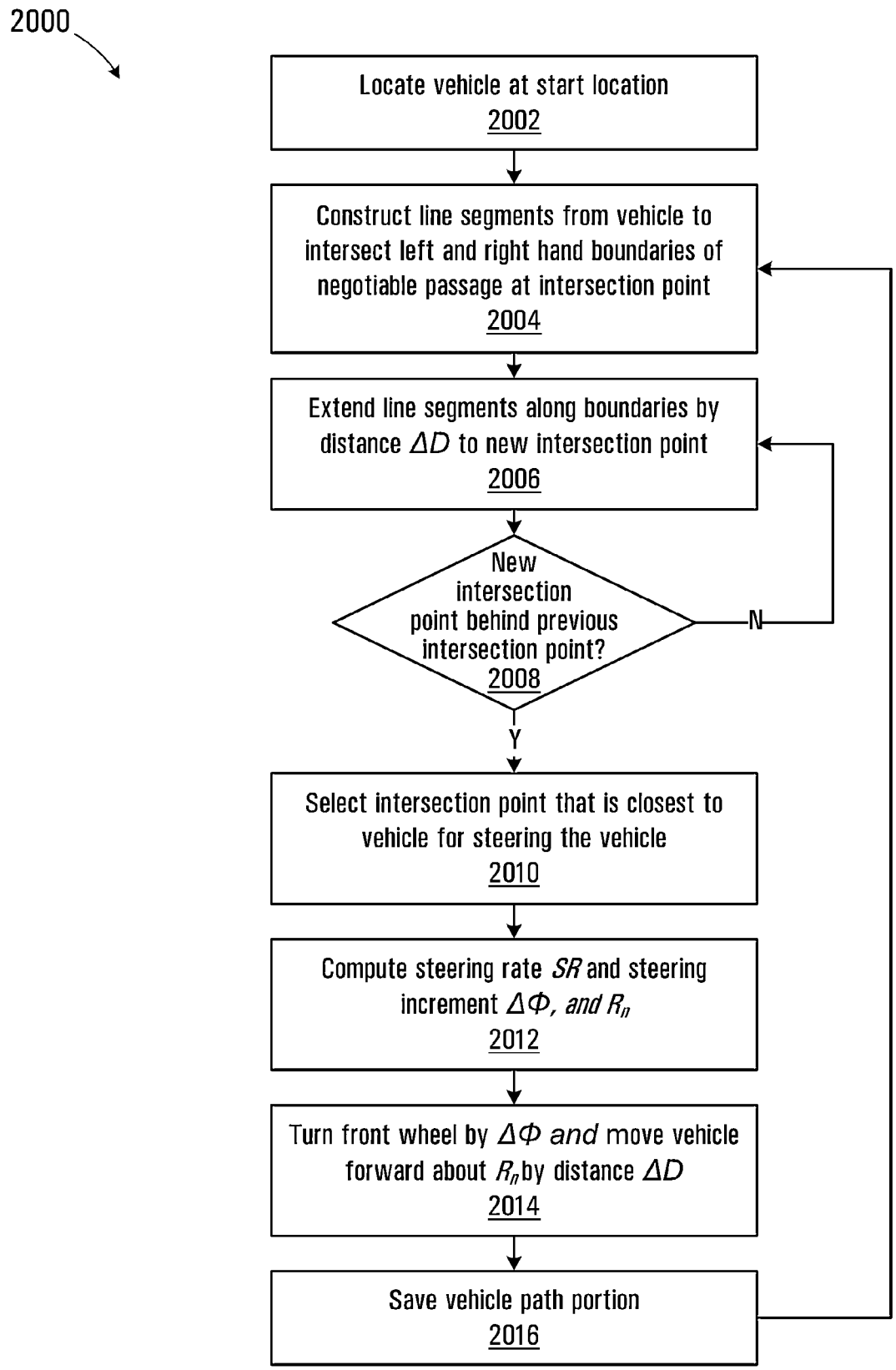
FIG. 20 is a block diagram of a process executed by the processor circuit shown in FIG. 2 for implementing a portion of the process shown in FIG. 16.
Figure 21:
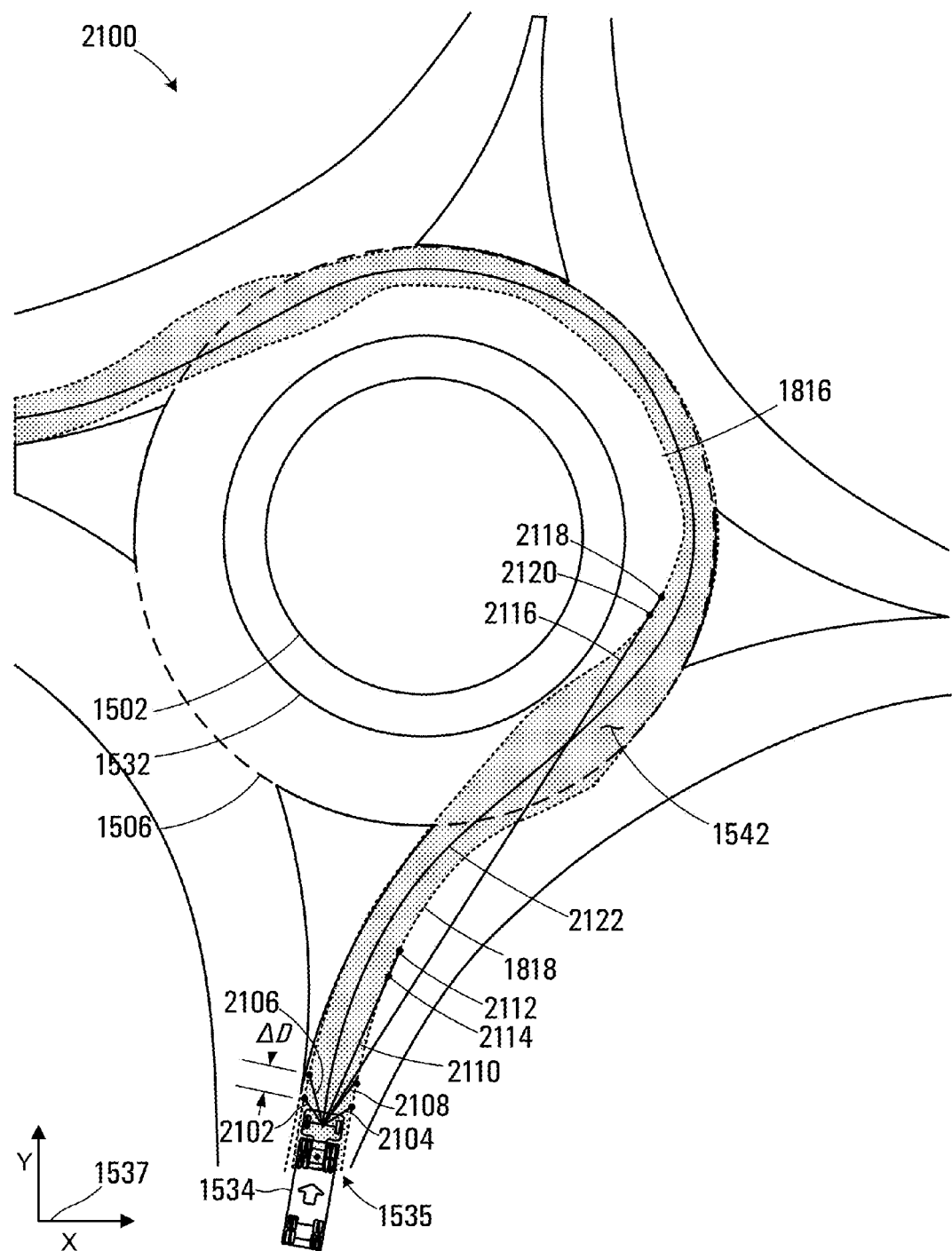
FIG. 21 is a schematic view of the roundabout intersection representation of FIG. 15 including a vehicle path representation.

Still referring to FIG. 19, at last some portions of the negotiable passage 1542 have sufficient width to permit the vehicle 1534 to steer along a plurality of different paths while remaining within the lateral boundaries 1900. A process for selecting between the plurality of different paths is shown in FIG. 20. Referring to FIG. 20, a flowchart depicting blocks of code for directing the processor circuit 200 to implement block 1610 of the process 1600 in accordance with one embodiment is shown generally at 2000. The process begins at block 2002, which directs the microprocessor 202 to locate the vehicle 1534 at the start location. Referring to FIG. 21, a portion of the roundabout 1500 is shown in enlarged view in FIG. 21 at 2100 and the vehicle 1534 is shown at the start location 1535.

Block 2004 of the process 2000 then directs the microprocessor 202 to construct a line segment 2102 from the vehicle to intersect the left hand boundary of the negotiable passage 1542. Block 2004 also directs the microprocessor 202 to construct a line segment 2104 from the vehicle to intersect the right hand boundary of the negotiable passage 1542.

Block 2006 then directs the microprocessor 202 to extend each of the line segments by the distance increment ΔD. The extended line segments are shown at 2106 and 2108 in FIG. 21. The process then continues at block 2008, which directs the microprocessor 202 to determine whether the new intersection points with the respective left and right boundaries of the negotiable passage 1542 are behind the respective previous intersection points. In the case of the line segments 2106 and 2108 the intersection points are not behind the previous intersection points (i.e. a driver would be able to see both intersection points) and block 2008 directs the microprocessor 202 back to block 2006. At block 2006 the line segments are again extended by a distance increment ΔD along the boundaries and blocks 2008 and 2006 are repeated until each line segment 2106 and 2108 has an intersection point behind a previous intersection point. Referring to FIG. 21, a line segment 2110 meets this criterion for the right hand boundary since the intersection point 2112 is obscured by the previous intersection point 2114. Similarly a line segment 2116 meets this criterion for the left hand boundary since the intersection point 2118 is obscured by the previous intersection point 2120.

The process 2000 then continues at block 2010, which directs the microprocessor 202 to select the intersection point that is closest to the vehicle 1534. In FIG. 21, the intersection point 2112 is closer to the vehicle 1534 than the intersection point 2118, and the point 2112 is thus selected as a steering target point for the vehicle.

Block 2012 then directs the microprocessor 202 to compute the steering rate SR using Eqn 2, the steering increment Δφ using Eqn 3, and the instantaneous turn radius $R_n$ using Eqn 4, as generally described earlier herein. The steering rate and steering increment are thus dependent on the vehicle speed and will constrain the steering rate of the vehicle 1534. Block 2014 then directs the microprocessor 202 to turn the front wheel of the vehicle 1534 by Δφ and to move the vehicle forward about the instantaneous turn radius $R_n$ by the distance increment ΔD toward the intersection point 2112.

Block 2016 then directs the microprocessor 202 to save the path traveled by the vehicle 1534 while advancing by ΔD as the first portion of the vehicle path for steering along the negotiable passage 1542. Block 2016 then directs the microprocessor 202 back to block 2004, and blocks 2004-2016 are repeated for the new vehicle location.

Implementation of the process 2000 thus results in a vehicle path being constricted on a portion-by-portion basis through the negotiable passage 1542. Referring again to FIG. 21, the selected vehicle path of the vehicle 1534 through the negotiable passage 1542 is represented by the line 2122. The vehicle path 2122 represents a smooth vehicle path along the negotiable passage 1542 that avoids obstacles such as edges of the roadways and splitter islands while reducing steering required by the driver of the vehicle and reducing the overall distance traveled around the roundabout 1500.

In some embodiments where the edges of the intersection or roadway have large variations (for example a winding road), the process 2000 may result in a vehicle path that is not smooth and may cause the vehicle 1534 to swing from left to right. This potential problem may be avoided by ignoring intersection points that meet the criterion in block 2008 but are closer than a pre-determined distance to the vehicle 1534. However, in some cases ignoring a point that is within the pre-determined distance to the vehicle 1534 may cause the vehicle to steer outside of the negotiable passage 1542. An additional criterion would thus be required at block 2008 to determine whether ignoring the point within the pre-determined distance would have this effect, in which case the closer intersection point would remain the steering target point even though the point falls within the pre-determined distance.

Referring back to FIG. 15, in the embodiment shown the roundabout 1500 has no geometry defined beyond the end of the exit lane 1522, which would cause the process 2000 to fail at the approach to the end location 1539. Accordingly, when generating the vehicle path for the exit lane 1522, the process 2000 may be discontinued when the vehicle 1534 is within a pre-determined distance of the end location 1539. In one embodiment the pre-determined distance may be a distance equal to twice the length of the tractor part of the articulated vehicle 1534.

While specific embodiments of the invention have been described and illustrated, such embodiments should be considered illustrative of the invention only and not as limiting the invention as construed in accordance with the accompanying claims.

What is claimed is:

1. A method for generating a representation of a vehicle path for display via a computer, the method comprising:
    receiving start location information at an interface of the computer, the start location information including a start location and an initial orientation of the vehicle at the start location;
    receiving end location information at the interface, the end location information including a desired end location of the vehicle;
    receiving at the interface, a selection of a vehicle for which the vehicle path is to he generated, the vehicle being defined by vehicle parameters that define a turning behaviour of the vehicle;
    receiving constraint information at the interface, the constraint information identifying at least one constraint to passage of the vehicle between the start location and the end location;
    receiving a vehicle speed indicating movement of the vehicle between the start location and the end location; and
    causing a processor circuit of the computer to generate at least one vehicle path for travel of the vehicle between the start location and the end location, the vehicle path being based on the vehicle speed and the turning behaviour of the vehicle and being generated such that the vehicle path remains within the at least one constraint.

2. The method of claim 1 wherein receiving the end location information comprises receiving end location information including a desired orientation of the vehicle at the end location.

3. The method of claim 1 wherein receiving the constraint information comprises receiving for the at least one constraint:
   a constraint location; and
   a tolerance value defining a permitted deviation of the vehicle path from the constraint location.

4. The method of claim 3 wherein receiving the constraint information further comprises receiving a desired orientation of the vehicle at the constraint location.

5. The method of claim 1 wherein receiving the constraint information comprises causing the processor circuit to determine whether the turning behaviour of the vehicle acts as a constraint to generation of a vehicle path that would be able to reach the end location.

6. The method of claim 5 further comprising causing the processor circuit to display an indication of a range of possible turns that the vehicle is capable of making from the start location and orientation.

7. The method of claim 1 wherein receiving the constraint information comprises receiving information defining a location and extent of an obstacle to movement of the vehicle between the start location and the end location.

8. The method of claim 7 wherein receiving the information defining the location and extent of the obstacle to travel comprises receiving information defining at least one of:
   a man-made structure;
   a natural landscape feature; and
   an edge of a roadway or thoroughfare.

9. The method of claim 1 wherein the end location comprises an intermediate end location and further comprising:
   receiving at the interface, end location information including a subsequent desired
   end location of the vehicle; and
   causing the processor circuit to generate a subsequent vehicle path portion for travel of the vehicle between the intermediate end location and the subsequent end location.

10. The method of claim 1 wherein causing the processor circuit to generate the at least one vehicle path comprises causing the processor circuit to determine whether the turning behaviour of the vehicle acts as a constraint to generation of a vehicle path that would be able to reach the end location and when the turning behaviour of the vehicle acts as a constraint:
    causing a warning to be issued; and
    discontinuing generation of the vehicle path.

11. The method of claim 9 further comprising causing the processor circuit to resume generation of the vehicle path in response to receiving revised end location information at the interface, wherein the revised end location information includes an end location that permits generation of a vehicle path that would be able to reach the end location.

12. The method of claim 1 wherein receiving the constraint information comprises receiving constraint information identifying a plurality of constraints and wherein causing the processor circuit to generate at least one vehicle path comprises causing the processor circuit to generate at least one vehicle path for travel of the vehicle between the start location and the end location within each of the plurality of constraints.

13. The method of claim 1 wherein receiving the constraint information comprises receiving constraint information identifying at least one of:
    a roadway that permits travel of a motor vehicle;
    a taxiway or runway that permits travel of an aircraft; and
    a railway for travel of rolling stock.

14. The method of claim 1 wherein the vehicle parameters include at least one parameter defining an extent of the vehicle and wherein generating the at least one vehicle path comprises generating a vehicle path that causes the at least one extent of the vehicle to remain within the at least one constraint while traveling along the vehicle path.

15. The method of claim 1 wherein receiving the constraint information comprises receiving data defining a vehicle path portion, and wherein generating the vehicle path comprises generating a vehicle path that includes the vehicle path portion.

16. The method of claim 15 wherein receiving the data defining the vehicle path portion comprises recovering data defining:
    a straight line;
    a curved line; and
    a waypoint.

17. The method of claim 1 wherein causing the processor circuit to generate at least one vehicle path comprises causing the processor circuit to generate a plurality of alternative vehicle paths for travel of the vehicle between the start location and the end location within the at least one constraint.

18. The method of claim 17 further comprising receiving at the interface, an operator selection of one of the plurality of alternative vehicle paths.

19. The method of claim 17 further comprising generating a figure of merit for each of the plurality of vehicle paths.

20. The method of claim 19 wherein generating the figure of merit comprises generating a figure of merit for each vehicle path based on at least one of:
    an operator workload associated with steering the vehicle to follow the vehicle path;
    a number of turns required while following the vehicle path;
    a time taken to traverse the vehicle path;
    an expected vehicle speed while following the vehicle path;
    safety criteria associated with travel along the vehicle path; and
    a distance over which the vehicle path extends.

21. The method of claim 1 wherein receiving the start location information comprises receiving data defining a line disposed at the start location, the line being oriented to define the orientation of the vehicle at the start location.

22. The method of claim 21 wherein causing the processor circuit to generate the at least one vehicle path comprises causing the processor circuit to generate a path having an initial trajectory extending from the line and aligned in a direction corresponding to an orientation of the line and wherein a length of the initial trajectory is proportional to a length of the line.

23. The method of claim 2 wherein receiving the end location information comprises receiving data defining a line disposed at the end location, the line being oriented to define the desired orientation of the vehicle at the end location.

24. The method of claim 23 wherein causing the processor circuit to generate the at least one vehicle path comprises causing the processor circuit to generate a path having a finishing trajectory aligned in a direction corresponding to the orientation of the line and wherein a length of the finishing trajectory is proportional to a length of the line.

25. The method of claim 1 wherein receiving the start location information and the end location information comprises causing the processor circuit to display a line in an initial orientation, the line having at least one interactive region for receiving operator input via an input device and further comprising changing at least one of a location and an orientation of the line in response to receiving user input at the at least one interactive region.

26. The method of claim 25 wherein the line comprises a curved line.

27. The method of claim 25 further comprising receiving at the interface, operator input defining a change to the line and further comprising causing the processor circuit to generate an updated vehicle path for travel of the vehicle based on the changed line.

28. The method of claim 1 wherein the vehicle parameters include at least one parameter defining a reference location on the vehicle and wherein generating the vehicle path comprises causing the processor circuit to display a line along which the reference location moves during passage of the vehicle between the start location and the end location.

29. The method of claim 28 wherein the reference location on the vehicle comprises one of:
a location of a steerable wheel of the vehicle; and
a location disposed midway between a pair of steerable wheels of the vehicle.

30. The method of claim 1 wherein causing the processor circuit to generate at least one vehicle path comprises causing the processor circuit to generate a vehicle path for travel of the vehicle in one of a forward direction and a reverse direction between the start location and the end location, the vehicle path being based on the turning behaviour of the vehicle when moving in the respective directions.

31. The method of claim 1 further comprising causing the processor circuit to read vehicle parameters that define extents of the vehicle and generating a swept path of the vehicle for travel along the vehicle path.

32. The method of claim 31 further comprising causing the processor circuit to generate a plurality of geometric elements representing outer edges of the swept path, each geometric element representing at least a portion of the outer edge and having associated data defining a location and a shape of the geometric element.

33. An apparatus for generating a representation of a vehicle path for display via a computer, the apparatus comprising a processor circuit operably configured to:
receive start location information at an interface of the computer, the start location information including a start location and an initial orientation of the vehicle at the start location;
receive end location information at the interface, the end location information including a desired end location of the vehicle;
receive at the interface, a selection of a vehicle for which the vehicle path is to be generated, the vehicle being defined by vehicle parameters that define a turning behaviour of the vehicle;
receive constraint information at the interface, the constraint information identifying at least one constraint to passage of the vehicle between the start location and the end location;
receive a vehicle speed indicating movement of the vehicle between the start location and the end location; and
cause the processor circuit of the computer to generate at least one vehicle path for travel of the vehicle between the start location and the end location, the vehicle path being based on the vehicle speed and the turning behaviour of the vehicle and being generated such that the vehicle path remains within the at least one constraint.

34. A method for generating a representation for display via a computer of a vehicle path between a start location and an end location, the method comprising:
receiving information at an interface of the computer defining lateral boundaries for movement of the vehicle between the start location and the end location;
receiving at the interface, a selection of a vehicle for which the vehicle path is to be generated, the vehicle being defined by vehicle parameters that define a steering behavior of the vehicle;
receiving a vehicle speed indicating movement of the vehicle between the start location and the end location;
generating a negotiable passage between the lateral boundaries based on the vehicle speed and the steering behavior of the vehicle, the negotiable passage defining a region of between the lateral boundaries within which the vehicle would be able to steer to negotiate the passage without encroaching on the lateral boundaries, at least a portion of the negotiable passage having sufficient lateral extent to permit the vehicle to follow a plurality of different vehicle paths when moving along the portion; and
generating the vehicle path by selecting between the different vehicle paths to reduce steering movements of the vehicle for movement along the negotiable passage.

35. The method of claim 34 wherein receiving information defining lateral boundaries comprises:
receiving data defining a left hand boundary curve extending at least partway between the start location and the end location; and
receiving data defining a right hand boundary curve extending at least partway between the start location and the end location.

36. The method of claim 35 wherein the left hand boundary curve and the right hand boundary curve are represented by continuous Bezier curves.

37. The method of claim 34 wherein at least one obstacle to movement of the vehicle is disposed between the start location and the end location and wherein receiving information defining lateral boundaries comprises generating the lateral boundaries to avoid the at least one obstacle.

38. The method of claim 34 further comprising receiving at the interface, information imposing a movement preference defining preferred portions for vehicle movement within the lateral boundaries.

39. The method of claim 38 wherein the receiving the information imposing a movement preference comprises receiving at least one of:
user input defining a user-preferred portion within the lateral boundaries;
information defining the start location;
information defining the end location;
information defining an area having a movement constriction;
information defining lanes for guiding vehicle movement;
information defining an area that may be encroached on by a vehicle;
information defining a speed constraint; and
information defining a steering rate constraint.

40. The method of claim 34 wherein generating the negotiable passage comprises:
steering the vehicle along an interim vehicle path extending along each of the lateral boundaries while generating a plurality of vehicle extents;
in response to one of the plurality of vehicle extents encroaching on one of the lateral boundaries, spacing the interim vehicle path inwardly until the vehicle extent is able to pass within the one of the lateral boundaries; and
reducing an extent between the lateral boundaries based on the interim vehicle path.

41. The method of claim 1 wherein causing the processor circuit to generate the at least one vehicle path for travel of the vehicle comprises:

causing the processor circuit to compute a minimum turn radius associated with the vehicle speed;

causing the processor circuit to compute a steering increment based on the vehicle speed; and generating at least a portion of the vehicle path by advancing a representation of the vehicle along the path by successive distance increments while causing the representation of the vehicle to successively increment the steering of the representation of the vehicle by the steering increment.

42. The method of claim 41 wherein causing the processor circuit to compute the minimum turn radius comprises causing the processor circuit to compute a minimum turn radius based on at least one of:

a superelevation of the surface; and a side friction factor.

43. The method of claim 41 wherein causing the processor circuit to compute the steering increment comprises causing the processor circuit to compute a steering increment based on at least one of:

a steering lock angle associated with the vehicle; and a lock-to-lock time for steering between respective left and right hand steering lock conditions for the vehicle.

44. The method of claim 1 wherein receiving the vehicle speed comprises one of:

receiving, via the interface, an input indicating a desired vehicle speed; and causing the processor to read a default vehicle speed stored in memory.

\* \* \* \* \*